United States Patent
Hwang et al.

(10) Patent No.: US 12,550,481 B2
(45) Date of Patent: Feb. 10, 2026

(54) METHOD TO IMPROVE PERFORMANCES OF TUNNEL JUNCTIONS GROWN BY METAL ORGANIC CHEMICAL VAPOR DEPOSITION

(71) Applicant: The Regents of the University of California, Oakland, CA (US)

(72) Inventors: David Hwang, Windermere, FL (US); Matthew S. Wong, Santa Barbara, CA (US); Shuji Nakamura, Santa Barbara, CA (US)

(73) Assignee: THE REGENTS OF THE UNIVERSITY OF CALIFORIA, Oakland, CA (US)

(*) Notice: Subject to any disclaimer, the term of this patent is extended or adjusted under 35 U.S.C. 154(b) by 265 days.

(21) Appl. No.: 18/546,484

(22) PCT Filed: Feb. 28, 2022

(86) PCT No.: PCT/US2022/018135
§ 371 (c)(1),
(2) Date: Aug. 15, 2023

(87) PCT Pub. No.: WO2022/183104
PCT Pub. Date: Sep. 1, 2022

(65) Prior Publication Data
US 2024/0145625 A1    May 2, 2024

Related U.S. Application Data

(60) Provisional application No. 63/154,262, filed on Feb. 26, 2021.

(51) Int. Cl.
*H10H 20/812* (2025.01)
*H10H 20/01* (2025.01)
(Continued)

(52) U.S. Cl.
CPC .... *H10H 20/812* (2025.01); *H10H 20/01335* (2025.01); *H10H 20/821* (2025.01); *H10H 20/8252* (2025.01)

(58) Field of Classification Search
None
See application file for complete search history.

(56) References Cited

U.S. PATENT DOCUMENTS

| 8,664,028 B2 * | 3/2014 | Shibata | H10H 20/01335 438/456 |
| 2004/0004223 A1 * | 1/2004 | Nagahama | B82Y 20/00 257/74 |

(Continued)

FOREIGN PATENT DOCUMENTS

| KR | 102160881 B1 | 9/2020 |
| WO | 2014074486 A1 | 5/2014 |
| WO | 2021050731 A1 | 3/2021 |

OTHER PUBLICATIONS

PCT International Search Report and Written Opinion dated Jun. 8, 2023 for PCT Application No. PCT/US2022/018135.
(Continued)

*Primary Examiner* — Alexander G Ghyka
(74) *Attorney, Agent, or Firm* — GATES & COOPER LLP

(57) ABSTRACT

A device including an activated p-type layer comprising a III-Nitride based Mg-doped layer grown by vapor phase deposition or a growth method different from MBE. The p-type layer is activated through a sidewall of the p-type layer after the removal of defects from the sidewall thereby increasing a hole concentration in the p-type layer. In one or more examples, the device includes an active region between a first n-type layer and the p-type layer; a second n-type layer on the p-type layer; and a tunnel junction between the second n-type layer and the p-type layer, and the
(Continued)

activated p-type layer has a hole concentration characterized by a current density of at least 100 Amps per centimeter square flowing between the first n-type layer and the second n-type layer in response to a voltage of 4 volts or less applied across the first n-type layer and the second n-type layer.

15 Claims, 25 Drawing Sheets

(51) Int. Cl.
*H10H 20/821* (2025.01)
*H10H 20/825* (2025.01)

(56) References Cited

U.S. PATENT DOCUMENTS

| | | | | |
|---|---|---|---|---|
| 2017/0309785 | A1* | 10/2017 | Watanabe | H10H 20/0137 |
| 2017/0338369 | A1* | 11/2017 | Wildeson | H10H 20/812 |
| 2017/0338373 | A1 | 11/2017 | Wildeson et al. | |
| 2019/0115499 | A1* | 4/2019 | Obata | H01L 21/0262 |
| 2019/0207043 | A1 | 7/2019 | Yonkee et al. | |
| 2020/0119179 | A1* | 4/2020 | Mishra | H10D 30/477 |

OTHER PUBLICATIONS

Extended European Search Report dated Feb. 4, 2025 for European Patent Application No. 22760566.4.

Kuwano, Y., et al., "Lateral Hydrogen Diffusion at p—GaN Layers in Nitride-Based Light Emitting Diodes with Tunnel Junctions", Japanese Journal of Applied Physics, Aug. 2013, pp. 08JK12-1-08JK12-3, vol. 52.

Hasan, S.M.N., et al., "All-MOCVD-grown gallium nitride diodes with ultra-low H01L resistance tunnel junctions", Journal of Physics D: Applied Physics, 2021, pp. 1-8, vol. 54.

Liu, C., et al., "GaN—on—Si Quasi-Vertical Power MOSFETs", IEEE Electron Device Letters, Jan. 2018, pp. 71-74, vol. 39, No. 1.

\* cited by examiner

METHOD TO IMPROVE PERFORMANCES OF TUNNEL JUNCTIONS GROWN BY METAL ORGANIC CHEMICAL VAPOR DEPOSITION

CROSS REFERENCE TO RELATED APPLICATIONS

This application claims the benefit under 35 U.S.C. Section 119(e) of co-pending and commonly-assigned U.S. Provisional Patent Application No. 63/154,262, filed Feb. 26, 2021, by David Hwang, Matthew S. Wong, and Shuji Nakamura, entitled "METHOD TO IMPROVE PERFORMANCES OF TUNNEL JUNCTIONS GROWN BY MOCVD,", which application is incorporated by reference herein.

BACKGROUND OF THE INVENTION

1. Field of the Invention

The present invention relates to tunnel junction devices and methods of making the same.

2. Description of the Related Art (Note: This application references a number of different references/publications as indicated throughout the specification by one or more reference numbers, e.g., x. A list of these different publications ordered according to these reference numbers can be found below in the section entitled "References." Each of these references is incorporated by reference herein.)

Since p-type III-nitride materials typically have high resistivity and low current spreading ability, current spreading layers, such as metals and transparent and conductive oxides (TCOs) are usually employed to enhance the current spreading performance.

However, these current spreading materials are light absorbing in the visible light spectrum, which can harm the optical efficiency of III-nitride devices such as light-emitting diodes (LEDs) and laser diodes (LDs). One alternative approach is to utilize n-type III-nitride materials as the current spreading layer to reduce light absorption while maintaining excellent electrical conductivity feature. The use of n-type III-nitride materials for current spreading is commonly referred as tunnel junction (TJ). III-nitride materials are typically grown by metalorganic chemical vapor deposition (MOCVD) for mass production, but hydrogen is produced as a byproduct during the deposition. Moreover, the resistivity of p-type III-nitride materials increases dramatically by hydrogen passivation, leading to insulative or highly resistive p-type layer after the formation of TJ using MOCVD. One way to remove hydrogen from the p-type layer after TJ growth, also known as activation, is to use sidewall activation, where hydrogen is diffused out from the sidewall of p-type layer.

SUMMARY OF THE INVENTION

This present invention describes a method that can improve the electrical performances of LEDs and LDs with MOCVD grown TJ using conventional cleanroom fabrication techniques. In typical devices employing sidewall activation, the activation takes place after defining the light-emitting area using dry etching, yet the LEDs or LDs remains very resistive compared to TJ grown by molecular beam epitaxy (MBE), where MBE is a hydrogen-free deposition method. Because dry etching creates sidewall damage, such as nitrogen vacancies, at the surfaces of sidewall, hydrogen diffusion is not optimal. This invention describes a method where chemical etchants are used to remove sidewall damage prior to sidewall activation, and remarkable electrical improvements are observed for devices employing this invention.

The present invention can be embodied in many ways including, but not limited to, the following embodiments.

1. A method for fabricating a device or an epitaxial layer, comprising:
   removing defects from a sidewall of a p-type layer; wherein the p-type layer comprises a III-Nitride based Mg-doped layer; and
   after the removing, activating the p-type layer through the sidewall to increase a hole concentration in the p-type layer.

2. The method of example 1, further comprising:
   forming a mesa comprising the p-type layer and the sidewall;
   removing the defects from the sidewall; and
   activating the p-type layer.

3. The method of examples 1 or 2, wherein the p-type layer is at least partially covered by an n-type layer so as to form a tunnel junction between the p-type layer and the n-type layer.
   The method of any of the examples 1-3, wherein the activating comprises thermal annealing at one or more temperatures more than 300° C. under an ambient gas including at least one of air, $O_2$, an oxide compound, or a diatomic gas.

4. The method of any of the examples 1-4, wherein the removing comprises chemical etching of the surface of the sidewall.

5. The method of any of the examples 1-4, wherein the removing comprises chemical etching steps separated by a cleaning step.

6. The method of any of the examples 1-4, wherein the removing comprises performing one or more treatment sequences, each sequence comprising contacting the sidewall with a first acid and/or first base at a first concentration, first temperature, and for a first duration, optionally cleaning the sidewall after the contacting and, after the cleaning (if performed), optionally contacting the sidewall with a second acid or second base at a second concentration, second temperature, and for a second duration.

7. The method of any of the examples 1-4, wherein:
   the removing comprises performing one or more treatment sequences, each sequence comprising contacting the sidewall with a first acid and/or first base at a first concentration, at a first temperature, and for a first duration, optionally performing an ultraviolet ozone treatment of the sidewall after the contacting and, after the ultraviolet ozone treatment (if performed), contacting the sidewall with a second acid and/or second base at a second concentration, second temperature, and for a second duration, and/or 8. The method of any of the examples 1-4, wherein the removing comprises:
   a first step using at least one of a first acid, first base, or first treatment having a composition and applying the at least one of the first acid, first base, or first treatment to the surface of the sidewall at a temperature, concentration and for a duration selected to remove the defects by oxidation of the sidewalls forming an oxide, and a second step using at least one of a second acid or second base having a composition, and applying the at least one of the second acid or second base to the oxide at a temperature, concentration, and for duration selected to remove the oxide.

9. The method of any of the examples 6-8, wherein the first duration and the second duration are in a range of 1-10 minutes and the first temperature and the second temperature are in a range of 40 degrees Celsius to 70 degrees Celsius or the first duration, the second duration, the first temperature, and the second temperature are selected such that the number of defects is reduced.

10. The method of example 9, wherein the first acid comprises phosphoric acid and the second acid comprises hydrofluoric acid.

11. The method of any of the examples 1-10, wherein the defects comprise n-type defects.

12. The method of examples 5 or 6, wherein the etching is to a depth of more than 5 nm.

13. The method of example 5 or 6, wherein the chemical etching uses a wet etchant containing oxygen or hydrogen atoms.

14. The method of any of the examples 1-13, wherein the device comprises an optical device comprising a light-emitting diode (LED), a laser diode, a solar cell, or a photodetector.

15. The method of any of the examples 1-13, wherein the device is an electronic device comprising a transistor, a high electron mobility transistor, or a power electronic device.

16. The method of any of the examples 1-14, wherein the device including the p-type layer is grown using metal organic chemical vapor deposition.

17. The method of any of the examples 3-16, wherein the device comprises:

a III-Nitride active region between a first III-Nitride n-type layer and the p-type layer;

the n-type layer comprising a second III-Nitride n-type layer on the p-type layer; and the tunnel junction between the second III-Nitride n-type layer and the p-type layer.

18. The method of example 17, wherein the device further comprises:

an anode contact layer between the second III-Nitride layer and a first metal contact; and the first III-Nitride n-type layer comprises a cathode contact layer;

the tunnel junction is between the anode contact layer and the cathode contact layer; and the device emits electromagnetic radiation in response to a recombination of holes with electrons in the active region when an electric field or voltage is applied across the anode contact layer and the cathode contact layer.

19. The method of example 18, wherein the anode contact layer comprises an $n^{++}$-type layer, n-type layer, or $n^+$-type layer, the first III-Nitride n-type layer comprises at least one of an n-type layer, $n^{++}$-type layer, or $n^+$-type layer, the second III-Nitride n-type layer comprises at least one of an $n^{++}$-type layer, an n-type layer, or an $n^+$-type layer, and the p-type layer comprises at least one of a $p^{++}$-type layer or a p-type layer.

20. The method of example 19, wherein:

further comprising the $p^{++}$-type layer between the p-type layer and the second III-Nitride n-type layer, the second III-Nitride n-type layer and the anode contact layer comprise an $n^+$-GaN layer between an $n^{++}$-GaN layer and an $n^+$-GaN layer, such that the n-GaN layer is thicker than the $n^{++}$-GaN layer and the $n^+$-GaN layer and a $n^+$-type doping concentration of the $n^+$-GaN layer is between a n'-doping concentration of the $n^{++}$-GaN layer and an n-doping concentration of the n-GaN layer; and the active region comprises InGaN.

21. The method of any of the examples 18-20, wherein the device comprises a micro-light emitting diode, the method further comprising:

dry etching a mesa comprising the first III-Nitride n-type layer, the second III-Nitride n-type layer, the p-type layer, the tunnel junction, and the active region, wherein a top surface of the mesa has a surface area of 100×100 micrometers squared or less; and performing a number n of the treatment sequences such that at least one of a resistivity or voltage between the anode contact layer and the cathode contact layer, at a given current density flowing between the anode contact layer and the cathode contact layer, is reduced as compared to n−1 treatment sequences and $n^+1$ treatment sequences.

22. The method of any of the examples 18-21, wherein the device comprises a micro-light emitting diode, comprising:

dry etching the mesa comprising the first III-Nitride n-type layer, the second n-III-Nitride type layer, the p-type layer, the tunnel junction, and the active region, wherein a top surface of the mesa has a surface area of 60×60 micrometers squared or less; and performing a number n of the treatment sequences such that a voltage of 4 volts or less is between the cathode contact layer and the anode contact layer when a current density of 20 Amps per centimeter square is flowing between the anode contact layer and the cathode contact layer.

23. The method of any of the examples 17-22, wherein the device comprises a micro-light emitting diode, the method further comprising:

dry etching a mesa comprising the first n-type layer, the second n-type layer, the p-type layer, the tunnel junction, and the active region, wherein a top surface of the mesa has a surface area of 60×60 micrometers squared or less; and performing a number n of the treatment sequences such that a peak external quantum efficiency and a peak wall plug efficiency of the microled are both greater than 50% and the wall plug efficiency and the external quantum efficiency are both greater than 30% for the current density up to 30 Amps per centimeter square.

24. The method of any of the examples 17-23, wherein the microled is a blue microled emitting the electromagnetic radiation having a peak intensity at a blue wavelength.

25. The method of example 24, further comprising performing the number n of treatment sequences wherein the light output power, external quantum efficiency, and wall plug efficiency are higher as compared to an equivalent microled without the tunnel junction and second III-Nitride n-type layer but further including an indium tin oxide p-contact layer on the p-type layer.

26. The method of any of the examples 17-21, wherein the microled is a green microled emitting the electromagnetic radiation having a peak intensity at a green wavelength.

27. The method of example 26, wherein the green microled has a light output power of at least 0.005 mW at a current density of 100 Amps per centimeter square.

28. The method of any of the examples 21-27, wherein the microled has a higher light output power, higher external quantum efficiency, and higher wall plug efficiency, and lower voltage, as compared to an equivalent microled activated by thermal annealing through holes in a mask on top of the mesa but that has not been treated with the sequence of treatments.

29. The method of any of the examples 18-28, further comprising selecting a thermal annealing temperature for activation that reduces the voltage between the anode contact layer and the cathode contact layer for the number of treatment sequences.

29. The method of example 29, wherein the annealing temperature is between 750 degrees Celsius and 800 degrees Celsius.

30. The method of example 17, wherein the active layer emits electromagnetic radiation in response to a voltage applied across the first III-Nitride n-type layer and the second III-Nitride n-type layer.

31. The method of any of the examples 1-30, wherein the device comprises a micro LED having a surface area less than 100 micrometers squared.

32. A device manufactured using the method of any of the examples 1-13.

33. A device comprising:
an activated p-type layer comprising a III-Nitride based Mg-doped layer grown by vapor phase deposition or a growth method different from molecular beam epitaxy (MBE), wherein the p-type layer is activated through a sidewall of the p-type layer after the removal of defects from the sidewall so as to increase a hole concentration in the p-type layer as compared to without the removal of the defects.

34. The device of example 33, further comprising:
an active region between a first III-Nitride n-type layer and the p-type layer;
a second III-Nitride n-type layer on the p-type layer; and
a tunnel junction between the second n-type layer and the p-type layer.

35. The device of example 33, wherein the activated p-type layer has a hole concentration characterized by a current density of at least 100 Amps per centimeter square flowing between the first n-type layer and the second n-type layer in response to a voltage of 4 volts or less applied across the first n-type layer and the second n-type layer.

36. The device of example 34 or 35, further comprising a light emitting device and a mesa comprising first the III-Nitride n-type layer, the second III-Nitride n-type layer, the p-type layer, and the active region, wherein the mesa has a light emitting top surface having an area of 60 microns squared or less.

37. The device of example 36, wherein the area is 5 microns squared or less.

38. The device of any of the examples 35-37, wherein the current density is at least 300 amps per centimeter square.

39. The device of any of the examples 33-38, wherein the activated p-type layer has the hole concentration characterized by the device having a wall plug efficiency of at least 25%.

40. The device of example 33, wherein the device comprises a light emitting diode, a laser, a solar cell, or a photodetector.

41. The device of example 33, comprising a transistor.

42. The device of example 33, comprising an electronic or optoelectronic device.

43. The device of any of the examples 33-42, wherein the vapor phase deposition comprises metal organic chemical vapor phase deposition.

44. A device, comprising:
a mesa;
a first metal contact on the mesa, wherein the mesa comprises:
a III-Nitride active region between a cathode contact layer and a p-type layer, wherein the cathode contact layer comprises a first III-Nitride n-type layer;
a second III-Nitride n-type layer on the p-type layer forming a tunnel junction between the second III-Nitride n-type layer and the p-type layer;
an n-type anode contact layer between the second III-Nitride layer and the first metal contact; and
a second metal contact on the cathode contact layer; wherein:
the device emits electromagnetic radiation in response to a recombination of holes with electrons in the active region when an electric field or voltage is applied across the anode contact layer and the cathode contact layer, and
the p-type layer has a chemically treated sidewall comprising a reduced number of defects of a type that:
are formed during formation of the mesa by dry etching, and
suppress diffusion of hydrogen, formed during growth of the p-type layer, out of the p-type layer during thermal activation of the device, and
so as to increase a hole concentration and reduce a voltage across the anode contact layer and the cathode contact layer for a given current density flowing between the anode contact layer and the cathode contact layer.

45. The device of example 44, wherein the reduced number of defects increase at least one of a light output power, an external quantum efficiency, or a wall plug efficiency of the device.

46. The device of example 44 or 45, wherein the voltage is between 2.5 V and 4V for the current density of 20 Amps per centimeter square.

47. The device of example 44 or 45, wherein the hole concentration in the p-type layer and an electron concentration in the first III-Nitride n-type layer are such that:
the external quantum efficiency and the wall plug efficiency are in a range of 25%-60% for a current density in a range 2-70 Amps per centimeter square, and a top of the mesa has a surface area of 60×60 microns squared or less.

48. The device of any of the examples 44 or 46, wherein the device comprises a green light emitting diode, the electromagnetic radiation comprises has a power of at least 0.003 mW at a green wavelength.

49. The device of examples 44-48, wherein the reduced number of defects reduce a number of Mg acceptors in the p-type layer that are not thermally activated to activate Mg dopants passivated by hydrogen in the p-type layer.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

First Example

Figure 1:
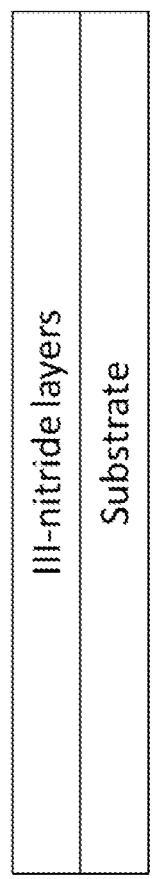
FIG. 1. Cross-sectional schematic of III-nitride wafer before the formation of tunnel junction.
Figure 2:
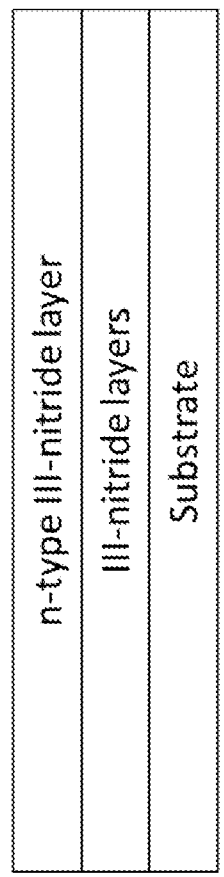
FIG. 2. Cross-sectional schematic of III-nitride wafer after the formation of tunnel junction using MOCVD.
Figure 3:
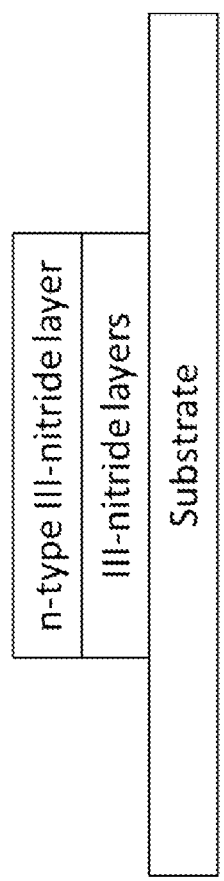
FIG. 3. Cross-sectional schematic showing defining device area using dry etching.
Figure 4:
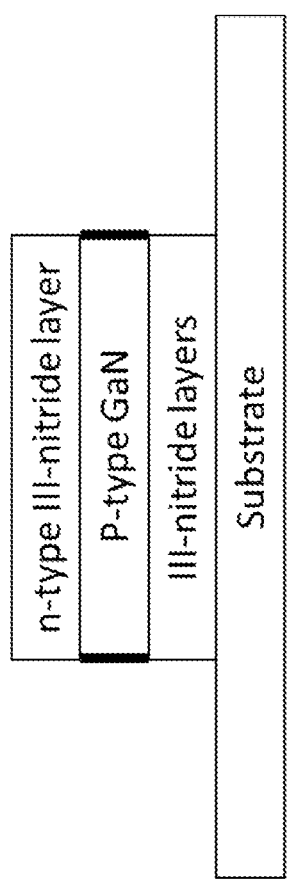
FIG. 4. Cross-sectional schematic showing formation of defective materials after dry etching.

FIG. 1 illustrates an n-type III-nitride layer is deposited using MOCVD on to a III-nitride wafer, wherein the wafer includes a substrate and n- and p-type III-nitride layers on the substrate. After the deposition of the III-nitride layer on the wafer, a tunnel junction is formed (FIG. 2). FIG. 3 illustrates a light-emitting area is patterned and defined using plasma based dry etching. FIG. 4 illustrates etching process creates sidewall damage and defects, such as nitrogen vacancies. These defects are n-type and act as a barrier for hydrogen activation in the p-type layer[1]. Because p-type III-nitride activation is possible through the sidewalls, where hydrogen is removed from the sidewall surface, the n-type sidewall defects serve as an activation barrier to decrease the activation efficiency for devices with TJ grown by MOCVD[2-4]. For the activation process, thermal annealing at least 300° C. is performed to drive away the hydrogen from the p-type layer.

Figure 5:
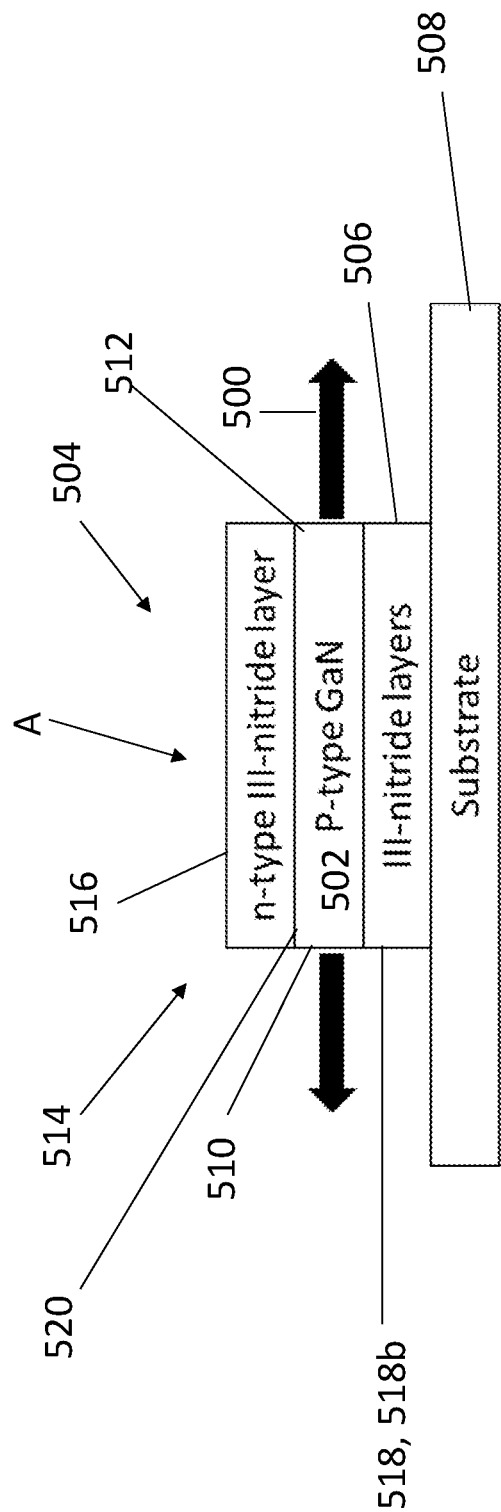
FIG. 5. Cross-sectional schematic showing removal of defective materials and thermal annealing to hydrogen at the sidewalls.
Figure 6:
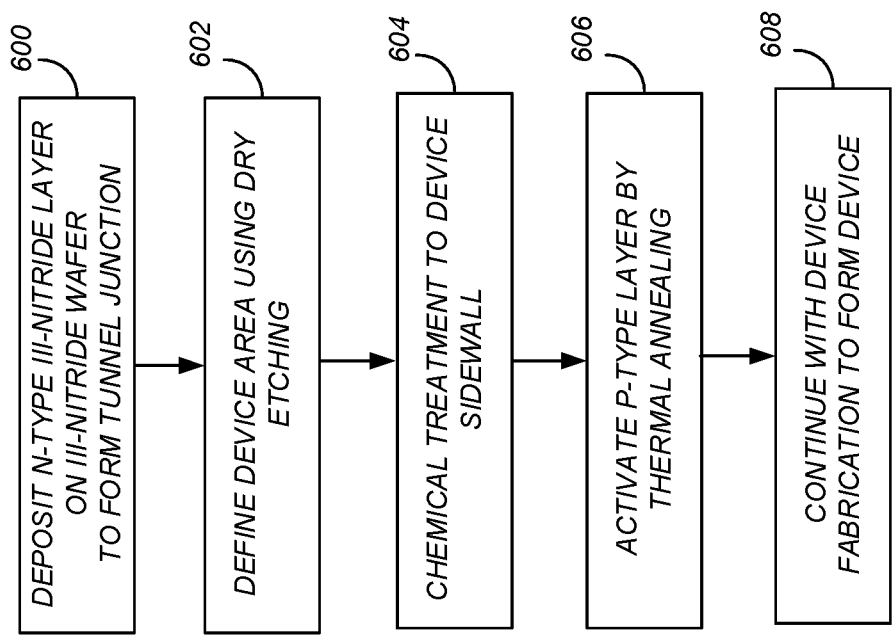
FIG. 6. Flowchart showing process flow of one or more embodiments of the invention.
Figure 7A:
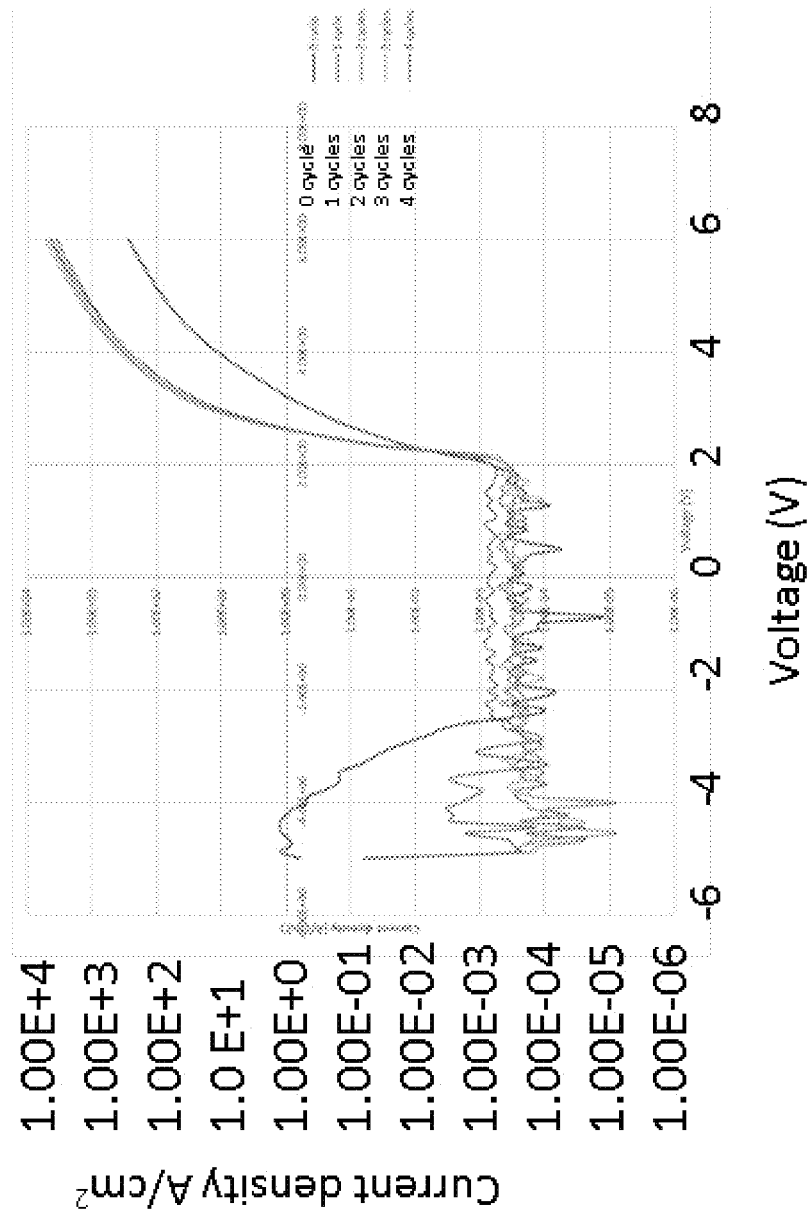
FIGS. 7A-7B. Measured data showing current-voltage performances of 5×5 μm² devices for different y axis scales.
Figure 7B:
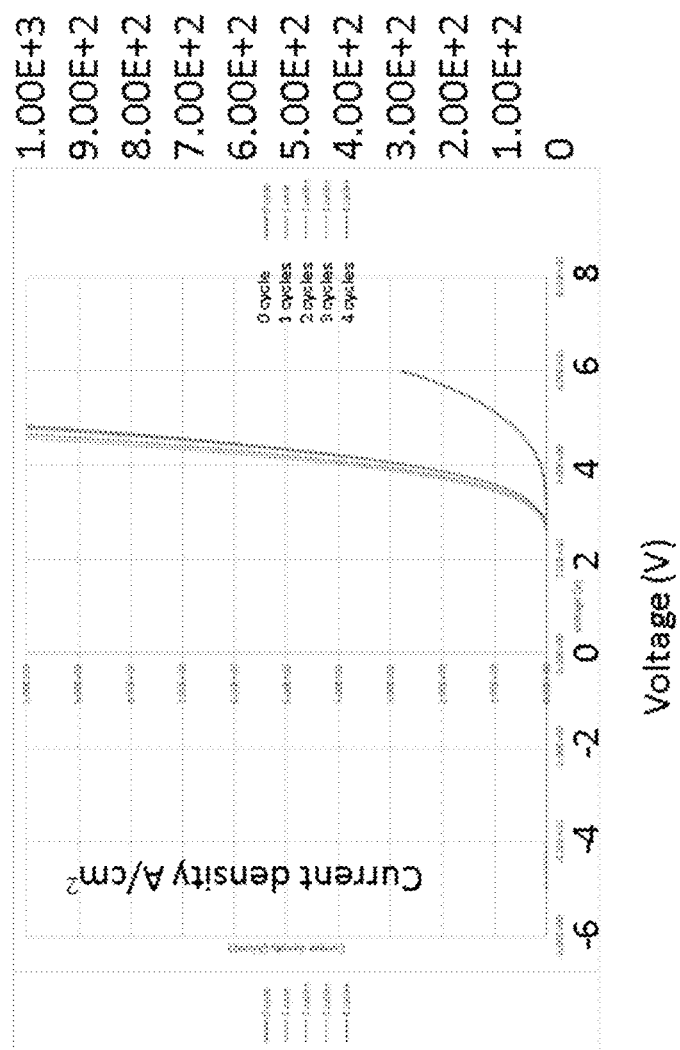
Figure 8A:
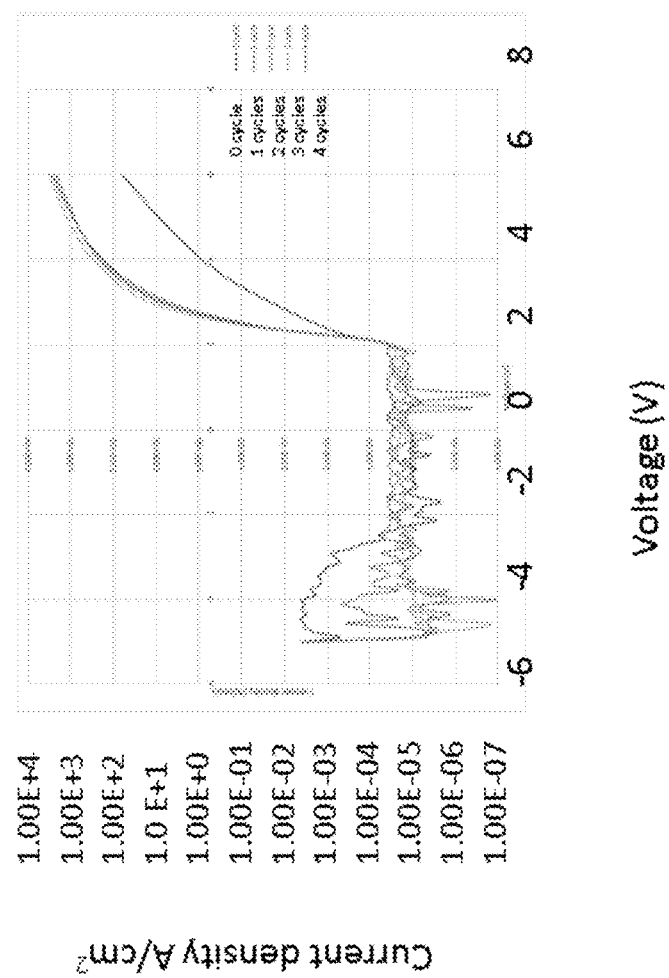
FIGS. 8A-8B. Measured data showing current-voltage performances of 20×20 μm² devices for different y axis scales.
Figure 8B:
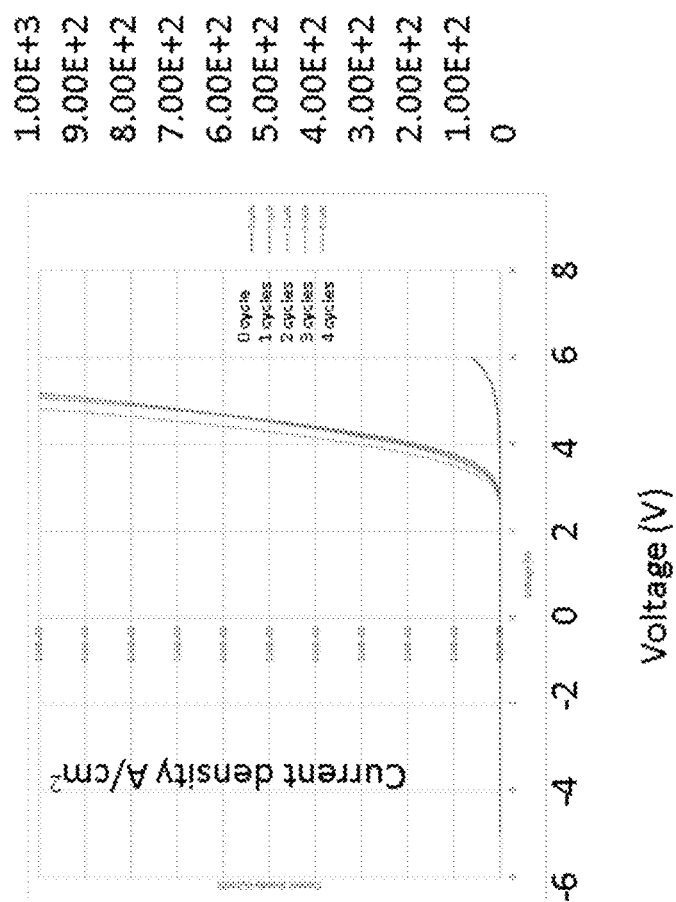
Figure 9A:
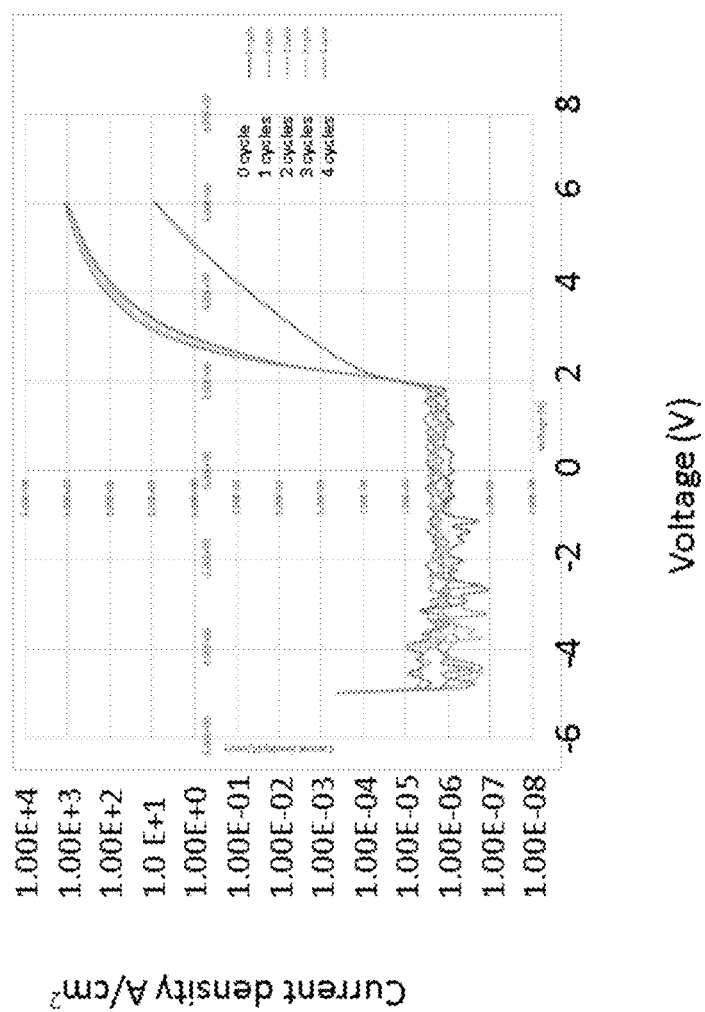
FIGS. 9A-9B. Measured data showing current-voltage performances of 60×60 μm² devices for different y axis scales.
Figure 9B:
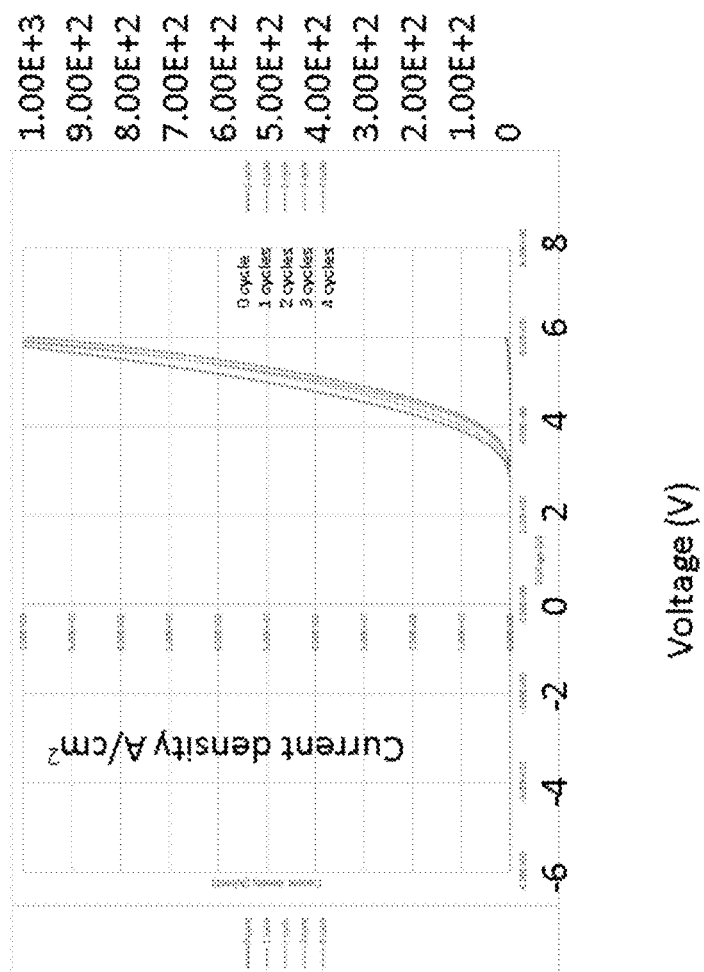
Figure 10:
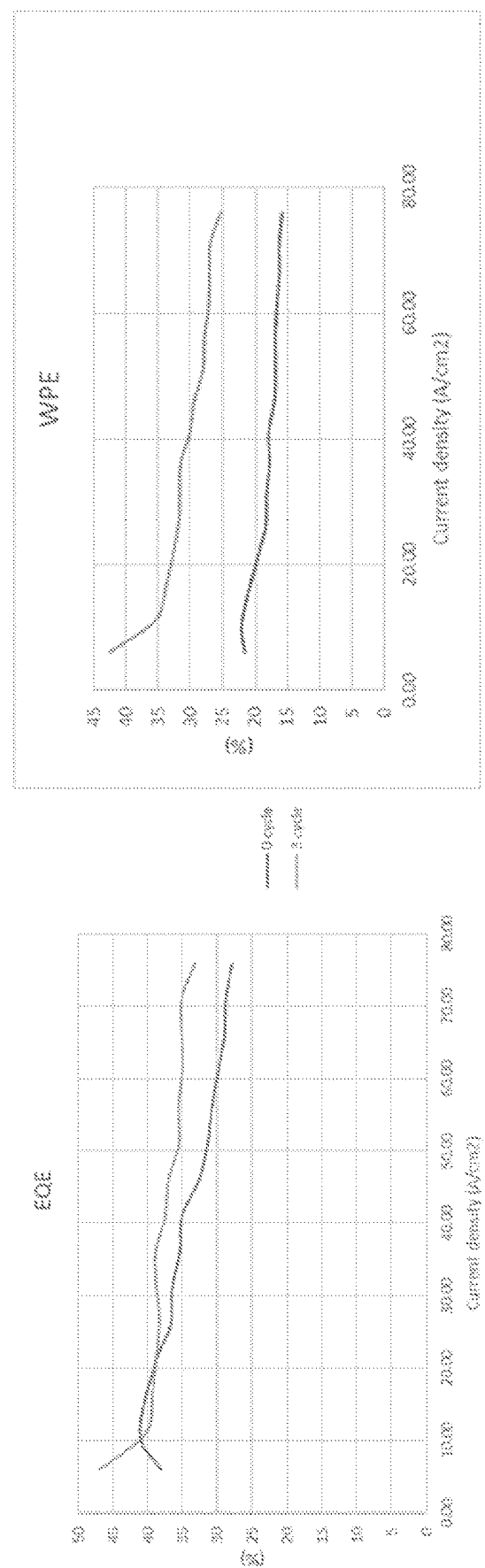
FIG. 10. External quantum efficiency (EQE) and wall-plug efficiency (WPE) of 20×20 μm² devices.
Figure 11:
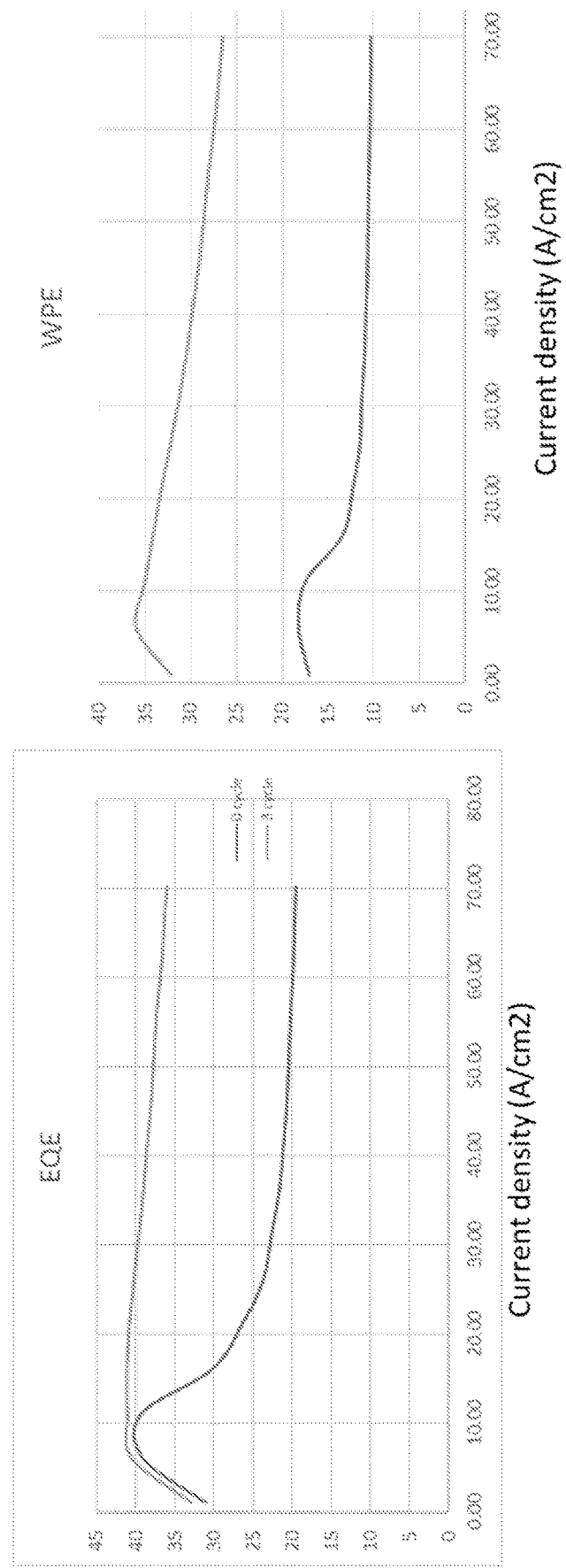
FIG. 11. External quantum efficiency (EQE) and wall-plug efficiency (WPE) of 60×60 μm² devices.

FIG. 5 illustrates a method to remove 500 sidewall defects before thermal annealing to improve the activation efficiency of the p-type III-nitride layer 502 according to one or more embodiments of the present invention. In the example of FIG. 5, the device or epitaxial layer 504 comprises the p-type layer 502 on III-Nitride layer 506 on a substrate 508; a surface 510 of a sidewall 512 of the p-type layer; a mesa 514 comprising the p-type layer and the sidewall; an n-type layer 516 on the p-type layer to form a tunnel junction. The procedure for fabricating the device or epitaxial layer is the following (referring also to FIG. 6). After the deposition step (Block 600, e.g., depositing n-type III-Nitride layer on III-Nitride wafer to form tunnel junction) and dry etching process to define the light-emitting area (Block 602), the exposed sidewalls are treated with chemical etchants (Block 604), such as phosphoric acid ($H_3PO_4$) or potassium hydroxide (KOH), to remove plasma damage. The experimental data presented here (FIGS. 7-11) shows demonstration for the micro light emitting devices after different cycles of chemical etchants, where each cycle consists of 5-minute $H_3PO_4$, 5-minute UV ozone plasma, and 5-minute buffered hydrofluoric acid. The sequence of chemical etchants presented here is an example of chemical etchants that can be employed and can be optimized. The use of chemical etchants after dry etching is to remove defective materials due to plasma etching, where the defective materials are n-type and can affect the activation efficiency in the p-type material. After the chemical treatment at the sidewalls, the wafer can be activated by thermal annealing (Block 606) and continue with further device fabrication (Block 608).

Devices manufactured using the method include light emitting devices (e.g., micro-light-emitting device structures and lasers) and electronic devices.

REFERENCES FOR FIRST EXAMPLE

The following references are incorporated by reference herein.

[1] X. A. Cao, S. J. Pearton, A. P. Zhang, G. T. Dang, F. Ren, R. J. Shul, L. Zhang, R. Hickman, and J. M. Van Hove, Appl. Phys. Lett. 75, 2569 (1999).
[2] D. Hwang, A. J. Mughal, M. S. Wong, A. I. Alhassan, S. Nakamura, and S. P. Denbaars, Appl. Phys. Express 11, 012102 (2018).
[3] E. C. Young, B. P. Yonkee, F. Wu, S. H. Oh, S. P. DenBaars, S. Nakamura, and J. S. Speck, Appl. Phys. Express 9, (2016).
[4] Y. Kuwano, M. Kaga, T. Morita, K. Yamashita, and K. Yagi, Jpn. J. Appl. Phys. 12, 8 (2013).

Second Example: Application to MicroLED

In recent years, micro-light-emitting diodes (μLEDs) have been gaining significant research attention for next-generation display and visible-light communication applications (1,2). There are a variety of approaches to realize full-color displays by employing red, green, and blue emitters (3-6). However, monolithic III-nitride-based μLEDs are particularly interesting for near-eye display applications, since this approach will simplify the mass transfer process with high pixel-per-inch standards (7,8). Tunnel junction (TJ) contacts have been utilized extensively to provide better optical and electrical properties in different III-nitride devices (9-12). Two growth methods have been widely used to realize TJ structures in the III-nitride material system, namely molecular-beam epitaxy (MBE) and metalorganic chemical vapor deposition (MOCVD). MBE-grown TJs have successfully shown great device performances, but MBE lacks the practical scalability for mass production (13-15). On the other hand, MOCVD gives good scalability, but the hydrogen-rich growth environment is problematic and post-growth annealing is necessary for hydrogen diffusion to activate the p-GaN (13,16). In the case of μLEDs, due to the small device sizes, lateral sidewall activation after dry etching has been used to activate the passivated p-GaN (17,18). Nevertheless, the voltage penalty due to incomplete activation remains the main drawback, which results in low wall-plug efficiency (WPE) for MOCVD-grown TJ devices, compared to devices with conventional current spreading contacts, such as indium-tin-oxide (ITO) (10,17).

In this example, the optoelectrical advantages of employing chemical treatments before sidewall activation are demonstrated by μLEDs with MOCVD-grown TJ contacts. The devices with chemical treatments prior to thermal annealing show a significant reduction in voltage penalty, where the voltage values are 5.43 V and 3.05 V at 20 A cm$^{-2}$ for the 20×20 μm$^2$ devices without and with chemical treatments before activation, respectively. This method is effective for device dimensions ranging from 5×5 to 100×100 μm$^2$. This indicates the voltage penalty issue in MOCVD-grown TJ contacts can be improved significantly not only from the conventional growth approaches but also from the fabrication aspect.

Additionally, the optical and electrical performances of the devices with MOCVD-grown TJ contacts are compared to devices with ITO contacts. Although the 20×20 μm$^2$ MOCVD-grown TJ device with chemical treatments results in a voltage penalty of 0.2 V compared to the ITO device, the MOCVD-grown TJ device provides improvements of 64% higher in peak external quantum efficiency (EQE) and 77% higher in peak WPE due to the substantial optoelectrical benefits. Thus, this example reveals the possibility of utilizing MOCVD-grown TJ structures in μLEDs and other optoelectronic devices.

1. Device Structure and Fabrication

The MOCVD-grown TJ structure was grown on commercial blue LED epitaxial structure on a sapphire substrate (peak wavelength of 465 nm at 20 A cm$^{-2}$) to minimize growth variation. The TJ structure consisted of 10 nm n$^{++}$-GaN layer grown at 825° C. ([Si]=1×10$^{20}$ cm$^{-3}$), 100 nm n-GaN layer grown at 900° C. ([Si]=4×10$^{19}$ cm$^{-3}$), and nm of n$^+$-GaN layer at 900° C. ([Si]=8×10$^{19}$ cm$^{-3}$). Before growing the TJ structure, a 5 min buffered hydrofluoric acid (BHF) dip was performed (14). After the TJ growth, μLEDs with seven device dimensions ranging from 5×5 to 100×100 μm$^2$ were fabricated. The light-emitting areas were defined using reactive-ion etching with silicon tetrachloride (SiCl$_4$) as the etching gas. Before thermal annealing for p-GaN activation, 0, 1, 2, 3, and 4 cycles of chemical treatments were performed on the devices. Each cycle of the chemical treatment comprised 5 min of phosphoric acid (H$_3$PO$_4$) at 60° C., 5 min ultraviolet-ozone (UVO) treatment using a UVO reactor (Jelight Model M-144AX), and 5 min BHF dip. The devices were annealed at 700° C. for 30 min under N$_2$/O$_2$ environment. An omnidirectional reflector (ODR) was deposited using ion beam deposition as a dielectric isolation layer, where the ODR consisted of three periods of alternating layers of silicon dioxide (SiO$_2$) and tantalum pentoxide, and aluminum oxide as a capping layer. After the ODR deposition, 50 nm of SiO$_2$ was deposited using atomic layer deposition for sidewall passivation. A window was opened for metal deposition using BHF, and common metal contacts of 500/100/500 nm of Al/Ni/Au were deposited. A reference set of pLEDs with 110 nm of ITO contact were fabricated with a similar method, where the detailed fabrication steps have been reported elsewhere (19).

b. Device Characterization

After device processing, the electrical characteristics were collected by on-wafer testing. For the measurements of light output power (LOP) and efficiency, the devices were singulated and packaged onto silver headers with encapsulation (Dow Corning OE-6650 resin), and the measurements were carried out in a calibrated integrating sphere. Sidewall activation is critical for MOCVD-grown TJ μLEDs, because hydrogen diffusion is only possible at sidewalls and the diffusion barrier in n-GaN is high due to the preferred H$^-$ state in n-type material as opposed to the favored H$^+$ state in the p-type material (20). However, sidewall activation is typically performed after dry etching, where the plasma-induced sidewall damage is introduced into the device structure (21,22). The etch damage may produce either mid-level defects or n-type material—both provide upward band bending from the interior p-type material and thus present a diffusion barrier for hydrogen (21-24) Thus, the sidewall damage due to dry etching must be removed before sidewall activation.

Figure 12:
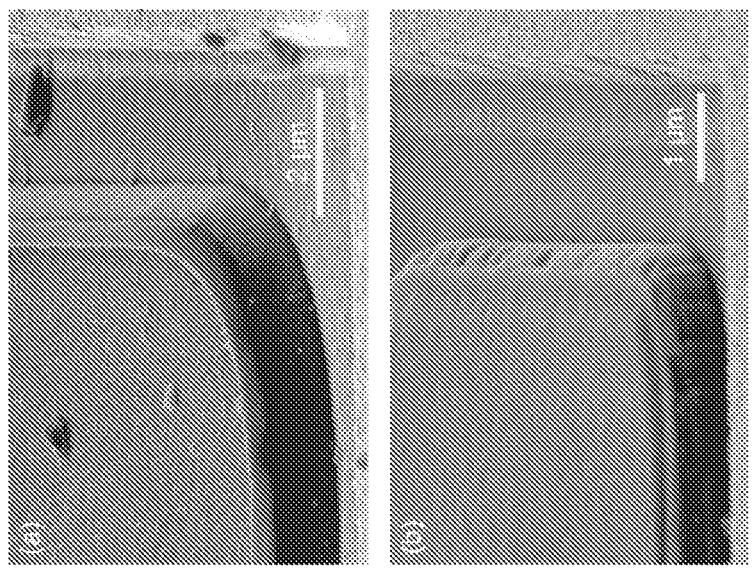
FIG. 12. Scanning Electron Microscope (SEM)images of the sidewall profiles of μLEDs (a) without and (b) with chemical treatments.

FIG. 12 shows the scanning electron microscopy (SEM) images of the sidewall profiles of devices without and with 3 cycles of chemical treatments. The sidewall profile of a device without chemical treatment showed a smooth surface due to the anisotropic nature of the dry etching, as shown in FIG. 12(a). On the other hand, in FIG. 12(b), the device with chemical treatments yielded a rougher and more vertical sidewall profile by using isotropic etching (24-26). Moreover, chemical treatments have been demonstrated to effectively eliminate sidewall damage by lateral etching the damaged surfaces, where the lateral etch is trivial to the conventional μLED size ranges (27,28).

Figure 13:
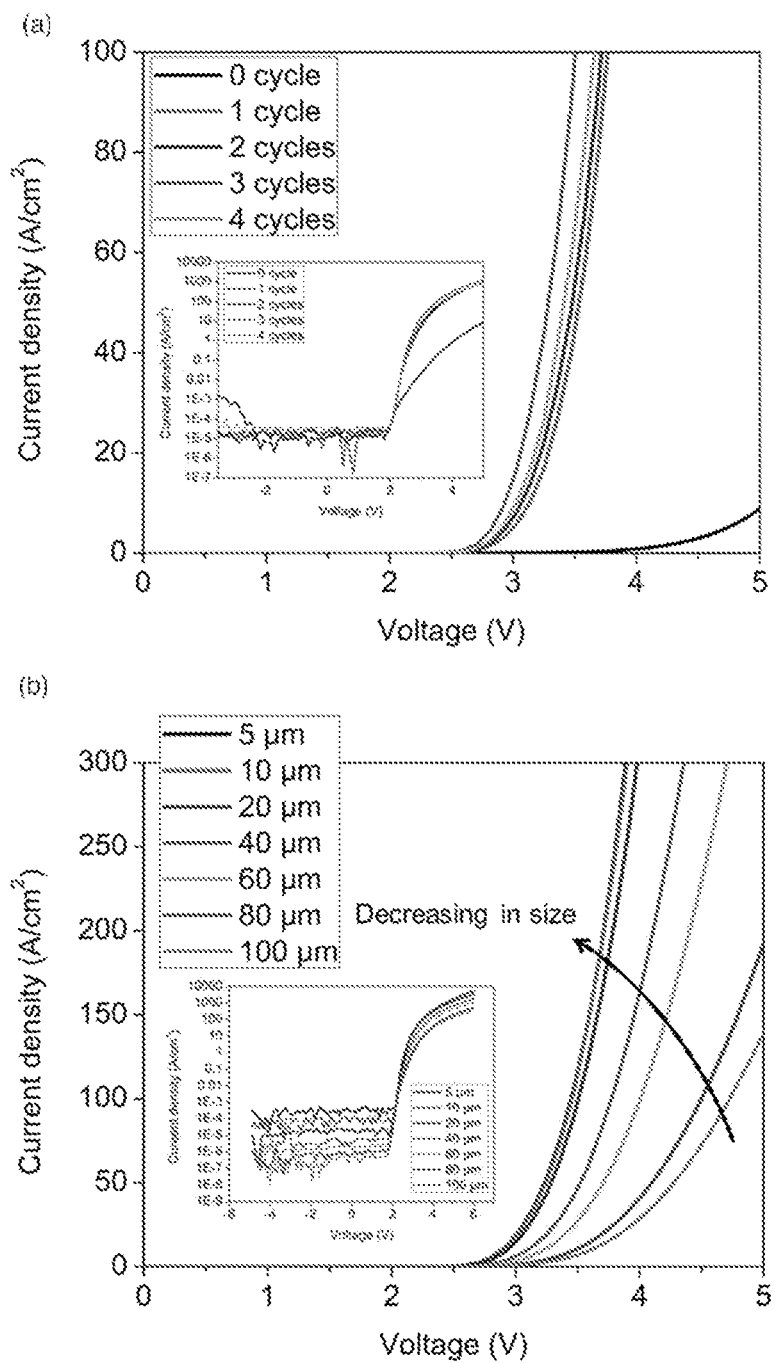
FIG. 13. (a) Current density—voltage characteristics of 20×20 μm² TJ devices with different cycles of chemical treatments and (b) current density—voltage characteristics of TJ devices with 3 cycles of chemical treatments using an activation condition at 700° C. for 30 min. The insets in (a) and (b) show the current density in log scale.

The effectiveness of the number of cycles for the chemical treatments before activation can be determined by the current density—voltage characteristics of the 20×20 µm² devices, as shown in FIG. 13(a). The device without chemical treatments, labelled as 0 cycle, resulted in similar device performance as other reports, where the current density—voltage characteristic showed very resistive behavior and high voltage penalty (10,11). In contrast, all the devices with different number of chemical treatment cycles showed improved forward current density—voltage characteristics, where the enhancement was attributed to the better p-GaN activation during thermal annealing. By utilizing chemical treatments, sidewall material, including etch damaged regions, are removed slowly after each cycle. Therefore, the greatest improvement was observed between devices with 0 and 1 cycles and the devices with 3 cycles yielded the optimal performance. Beyond the optimal chemical treatment condition, which was 3 cycles in this case, further chemical treatment cycles would result in more resistive electrical characteristic. The increase in resistivity with excessive chemical treatment cycles was attributed to the formation of n-type diffusion barrier due to the oxidation mechanism.

The additional number of chemical treatment cycles provides oxygen at the sidewalls, where oxygen acts as a donor in the p-GaN and converts to n-type, and hence immoderate use of chemical treatments would result in more resistive characteristic than the optimal condition (24,29). A key feature of sidewall activation is related to the device size. Larger device dimensions require longer activation time for hydrogen diffusion, since more time is needed for hydrogen to diffuse to the sidewalls 18) FIG. 13(b) shows that smaller devices achieved higher current density at the same applied voltage (30,31). However, the resistivity and the voltage penalty increased with device size, suggesting larger devices suffered from the incomplete activation due to the bigger area. Because this proposed method relies on sidewall activation, this method is effective to device dimensions less than 40 µm, yet additional activation is needed to utilize this method on devices with larger area (18).

Figure 14:
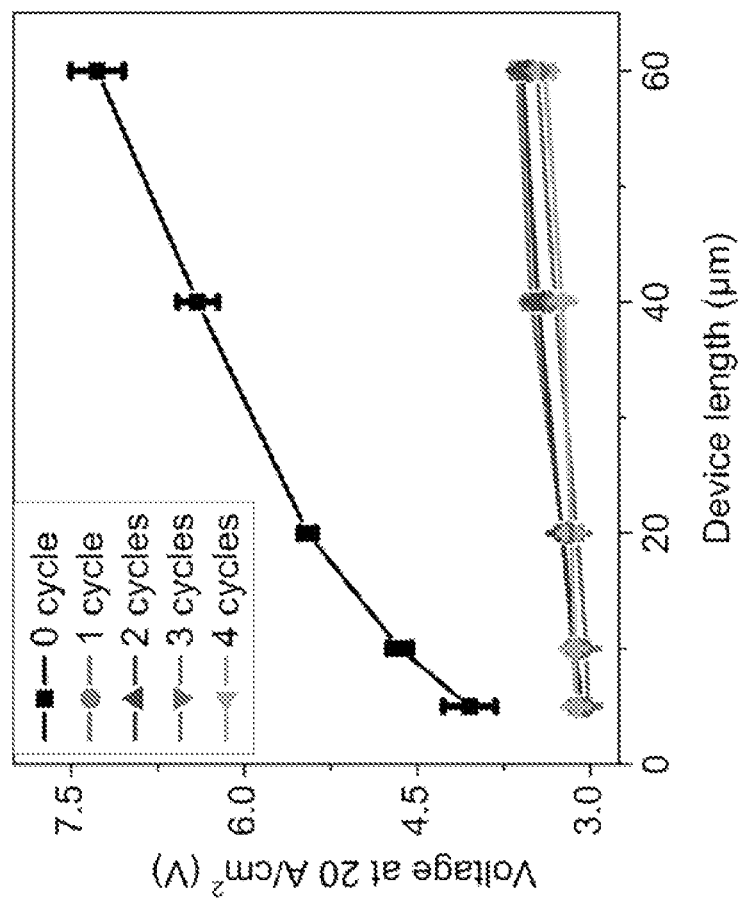
FIG. 14. The average voltage at 20 A cm$^{-2}$ from 5×5 to 60×60 μm² devices with a different number of chemical treatment cycles FIG. 15. (a) Current density—voltage characteristics and (b) light output power—current density characteristics of 20×20 μm² devices with ITO and TJ contacts.

FIG. 14 illustrates the average voltage values of ten devices at 20 A cm$^{-2}$ with different device dimensions, where greater device dimensions yielded higher voltage penalty. Moreover, FIG. 14 shows that the use of chemical treatments before thermal activation yields excellent uniformity across different devices. Thus, the data demonstrates the method is effective for typical µLED dimensions and further optimizations in the TJ structure and activation conditions can be performed.

c. Comparison of TJ and ITO contacts

Figure 15:
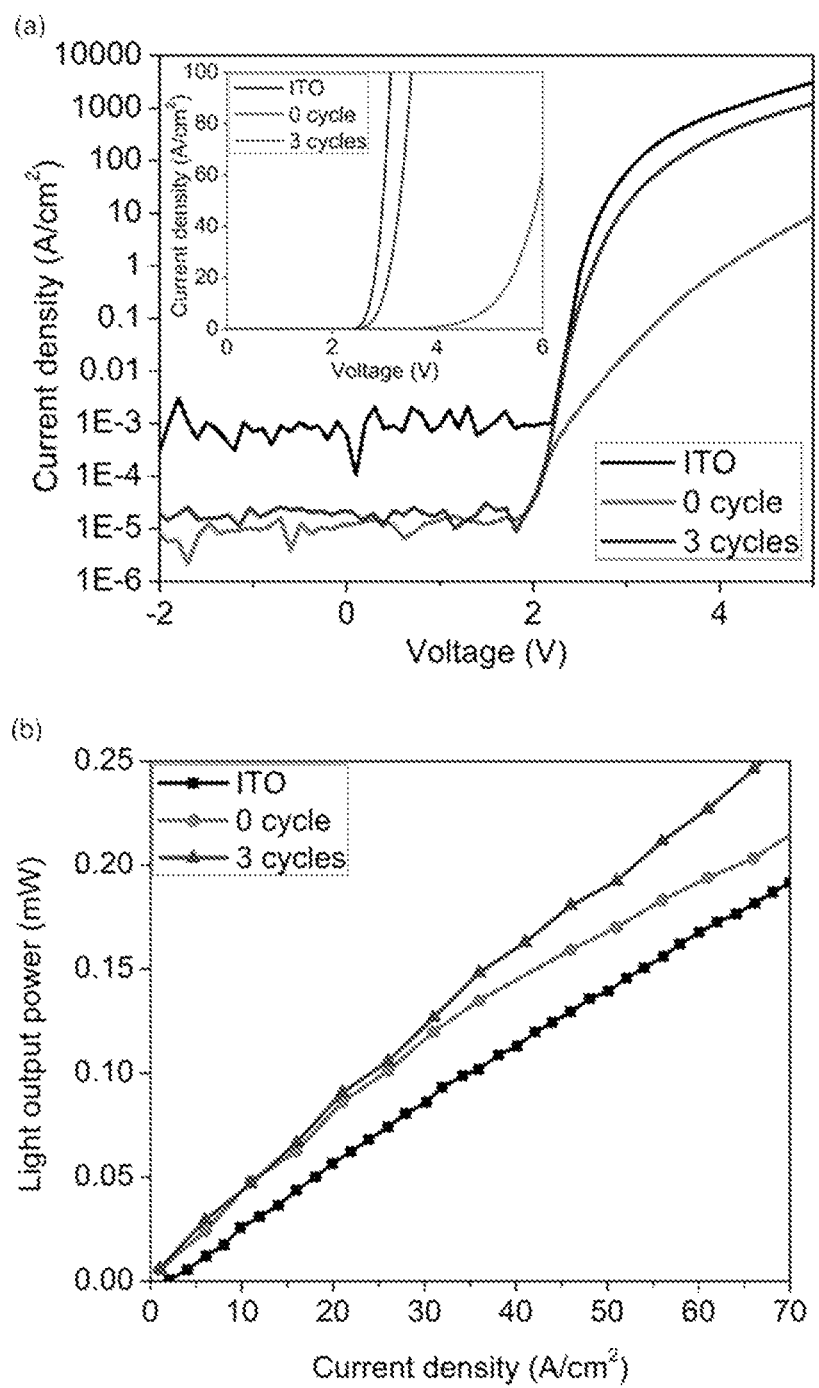

To examine the practical usage of the MOCVD-grown TJ devices, the device performances with TJ and ITO contacts are compared. The electrical and optical characteristics of the 20×20 µm² devices are presented in FIG. 15. At 20 A cm$^{-2}$, the voltage values were 2.85 V, 5.43 V, and 3.05 V for devices with ITO contact, TJ without chemical treatments before activation, and TJ with 3 chemical treatment cycles before activation, respectively, as shown in FIG. 15(a). The voltage difference between devices with ITO and TJ contacts without chemical treatment was 2.58 V, and the enormous voltage penalty prohibited the use of MOCVD TJ in any practical device design. Nevertheless, the voltage penalty between ITO and TJ contacts with chemical treatments was 0.2 V at 20 A cm$^{-2}$, where the voltage difference is lower than the TJ contact grown by MBE (32). The optical data in FIG. 15(b) demonstrates that TJ devices give greater LOP than ITO devices, because TJ, or n-GaN, has higher optical transparency (14,17). The same trend was observed in the measurements, where TJ devices without and with 3 chemical treatment cycles showed the enhancements of 42% and 46% at 20 A cm$^{-2}$ and 15% and 30% at 60 A cm$^{-2}$, respectively, compared to the ITO device. We were unable to measure the LOP of the ITO device below 2.5 A cm$^{-2}$, likely due to the greater leakage current, indicating more non-radiative sites are presented. The TJ device without chemical treatments resulted in lower LOP, especially in the higher current density regime above 30 A cm$^{-2}$, and this was attributed to the device heating due to the high voltage penalty.

Figure 16:
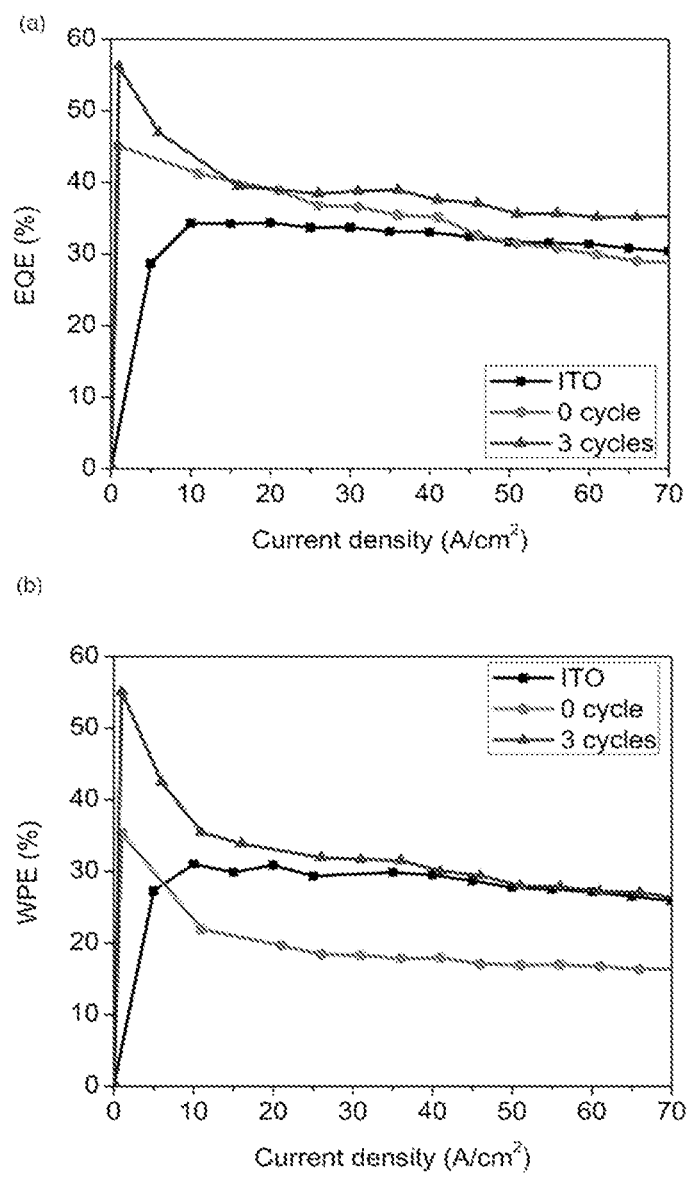
FIG. 16. (a) EQE and (b) WPE of 20×20 μm² devices with ITO or TJ contacts.

By separately analyzing the electrical and optical performances of the µLEDs, TJ and ITO contacts offered different benefits. As a result, it is essential to determine the EQE and WPE of the devices. FIGS. 16(a) and 16(b) show the EQE and the WPE of the 20×20 µm² devices with ITO and TJ contacts, respectively. The maximum EQE and WPE values were 34% and 31% for the ITO device, and 56% and 55% for the TJ device with chemical treatments, respectively. The TJ device with chemical treatments had 64% and 77% greater peak EQE and WPE compared to the ITO device, respectively, which could be attributed to higher LOP at the low current density range. Both TJ devices showed higher EQE than the ITO device, this was attributed to the less optical absorption feature of the TJ layer. Additionally, since the TJ and the device with 3 cycles of chemical treatments exhibited further EQE and WPE improvements than that without chemical treatments, the enhancement in efficiency could also be attributed to the textured sidewalls and the improved carrier injection after chemical treatments (23,24). For the EQE performance, the TJ device with chemical treatments yield EQE about 10% higher than that of the ITO device, whereas the EQE of the TJ device without chemical treatments decreased gradually with current density and resulted in slightly lower EQE than the ITO device beyond 50 A cm$^{-2}$. The decrease in EQE of the TJ device without chemical treatments was attributed to greater thermal droop due to device heating and reduction in LOP. In terms of the WPE performance, the device without chemical treatments suffered from low WPE because of the high voltage penalty and the drop in WPE were about 40% at 20 A cm$^{-2}$ and 50% at 60 A cm$^{-2}$. However, the device with chemical treatments showed higher WPE at low current density and almost identical WPE at high current density, compared to the ITO device. The higher WPE performance at low current density was attributed to the greater LOP, where the voltage penalty was relatively low enhancement in LOP was significant, and the increase in WPE diminished with current density. As the current density increased, the voltage penalty also increased from 0.2 V at 20 A cm$^{-2}$ to 0.3 V at 70 A cm$^{-2}$, yet the additional LOP in the TJ device was sufficient to compensate for the voltage penalty to maintain the WPE as high as the ITO device.

In conclusion, the electrical properties of µLEDs with MOCVD-grown TJ contacts were significantly enhanced by employing chemical treatments before sidewall activation. The applied chemical treatments removed damaged sidewall material that inhibited efficient activation of the p-GaN. The 20×20 µm² devices yielded 0.2 V voltage penalty at 20 A cm$^{-2}$, compared to ITO devices, and that is comparable to TJ structure grown by MBE. The TJ devices showed more than 40% and 30% improvements in LOP at 20 and 60 A cm$^{-2}$. Due to the high LOP, the TJ device resulted in 64% and 77% improvements in the peak EQE and WPE, respectively. This work demonstrates that MOCVD-grown TJ structures can be utilized in µLEDs while exhibiting outstanding optical and electrical characteristics and achieving efficiency better than conventional ITO current spreading contacts.

REFERENCES FOR SECOND EXAMPLE

The following references are incorporated by reference herein.
1) M. S. Wong, S. Nakamura, and S. P. DenBaars, ECS J. Solid State Sci. Technol. 9, 015012 (2020).
2) Y. Huang, E. Hsiang, M. Deng, and S. Wu, Light: Sci. Appl. 9, 105 (2020).
3) J.-T. Oh et al., Opt. Express 26, 11194 (2018).
4) M. S. Wong et al., Opt. Express 28, 5787 (2020).
5) Y. Lin, Y. Lu, W. Guo, C.-F. Lee, S.-W. Huang Chen, H.-C. Kuo, S. Liang, C.-W. Sher, T. Wu, and Z. Chen, Appl. Sci. 8, 1557 (2018).
6) H.-Y. Lin, C.-W. Sher, D.-H. Hsieh, X.-Y. Chen, H.-M. P. Chen, T.-M. Chen, K.-M. Lau, C.-H. Chen, C.-C. Lin, and H.-C. Kuo, Photonics Res. 5, 411 (2017).
7) S. Ichikawa, K. Shiomi, T. Morikawa, D. Timmerman, Y. Sasaki, J. Tatebayashi, and Y. Fujiwara, Appl. Phys. Express 14, 031008 (2021).
8) Y. Robin, F. Hemeret, G. D'*Inca*, M. Pristovsek, A. Trassoudaine, and H. Amano, Jpn. J. Appl. Phys. 58, SCCC06 (2019).
9) E. Vadiee et al., Appl. Phys. Express 11, 082304 (2018).
10) K. W. Hamdy, E. C. Young, A. I. Alhassan, D. L. Becerra, S. P. DenBaars, J. S. Speck, and S. Nakamura, Opt. Express 27, 8327 (2019).
11) J. A. Kearns, J. Back, D. A. Cohen, S. P. DenBaars, and S. Nakamura, Opt. Express 27, 23707 (2019).
12) S. Lee, C. A. Forman, J. Kearns, J. T. Leonard, D. A. Cohen, S. Nakamura, and S. P. DenBaars, Opt. Express 27, 31621 (2019).
13) E. C. Young, B. P. Yonkee, F. Wu, S. H. Oh, S. P. DenBaars, S. Nakamura, and J. S. Speck, Appl. Phys. Express 9, 022102 (2016).
14) B. P. Yonkee, E. C. Young, S. P. DenBaars, S. Nakamura, and J. S. Speck, Appl. Phys. Lett. 109, 191104 (2016).
15) B. P. Yonkee, E. C. Young, C. Lee, J. T. Leonard, S. P. DenBaars, J. S. Speck, and S. Nakamura, Opt. Express 24, 7816 (2016).
16) S. Nakamura, T. Mukai, M. Senoh, and N. Iwasa, Jpn. J. Appl. Phys. 31, L139 (1992).
17) D. Hwang, A. J. Mughal, M. S. Wong, A. I. Alhassan, S. Nakamura, and S. P. Denbaars, Appl. Phys. Express 11, 012102 (2018).
18) Y. Kuwano, M. Kaga, T. Morita, K. Yamashita, K. Yagi, M. Iwaya, T. Takeuchi, S. Kamiyama, and I. Akasaki, Jpn. J. Appl. Phys. 12, 08JK12 (2013).
19) M. S. Wong, D. Hwang, A. I. Alhassan, C. Lee, R. Ley, S. Nakamura, and S. P. DenBaars, Opt. Express 26, 21324 (2018).
20) J. Neugebauer and C. G. Van De Walle, Appl. Phys. Lett. 68, 1829 (1996).
21) X. A. Cao, S. J. Pearton, A. P. Zhang, G. T. Dang, F. Ren, R. J. Shul, L. Zhang, R. Hickman, and J. M. Van Hove, Appl. Phys. Lett. 75, 2569 (1999).
22) J. M. Lee, K. M. Chang, S. W. Kim, C. Huh, I. H. Lee, and S. J. Park, J. Appl. Phys. 87, 7667 (2000).
23) J. Kou, C.-C. Shen, H. Shao, J. Che, X. Hou, C. Chu, K. Tian, Y. Zhang, Z.-H. Zhang, and H.-C. Kuo, Opt. Express 27, 643 (2019).
24) C. Le Maoult, D. Vaufrey, F. Martin, E. Martinez, E. Nolot, S. Cadot, and E. Gheeraert, Proc. SPIE 11280, 112801C (2020).
25) M. S. Wong, C. Lee, D. J. Myers, D. Hwang, J. A. Kearns, T. Li, J. S. Speck, S. Nakamura, and S. P. Denbaars, Appl. Phys. Express 12, 097004 (2019).

Third Example: Comparative Study

In this example, the optoelectrical performances of blue and green TJ μLEDs with three activation methods are compared at different activation temperatures ranging from 670 to 790° C. in 30° C. increments. From the optical features, the devices with chemical treatment before sidewall activation exhibited uniform electroluminescence (EL) at 1 A/cm$^2$, whereas the devices with sidewall activation without chemical treatment or with the SAG design exhibited inhomogeneous EL patterns. Moreover, the LOP of the 20×20 μm$^2$ blue devices with chemical treatment was 15% higher than that of the SAG devices at 100 A/cm$^2$. In the optical performance, the blue μLEDs showed smaller degradation in LOP with increasing temperatures than the green devices, and the reduction in LOP for both devices was more significant for activation temperature above 730° C.

In the electrical performance, the 5×5 μm$^2$ devices with chemical treatment or SAG showed superior operating voltage at 20 A/cm$^2$ at all activation temperatures, while the voltage penalty decreased gradually with activation temperature for devices with only sidewall activation. Due to the greater LOP and similar electrical performances, the 5 μLEDs with chemical treatment before activation yielded higher external quantum efficiency (EQE) and wall-plug efficiency (WPE) at low current density than the devices with SAG, and the enhancements were observed in both 20×20 and 60×60 μm$^2$ devices.

1. Device Structure and Fabrication

Commercial blue (467 nm) and green (532 nm) InGaN LED epitaxial structure with a 20 nm of p$^+$-contact layer ([Mg] 9×10$^{19}$ cm$^{-3}$) and a 40 nm of p-layer ([Mg] 1×19 cm$^{-3}$) on sapphire substrates were used to minimize material variation. The TJ structure that consisted of 10 nm n$^{++}$-GaN layer ([Si] 1×10$^{20}$ cm$^{-3}$), 100 nm n-GaN layer ([Si] 4×10$^{19}$ cm$^{-3}$), and 10 nm of n$^+$-GaN layer ([Si] 8×10$^{19}$ cm$^{-3}$) was grown by MOCVD. The detailed device fabrication with sidewall passivation using atomic-layer deposition has been reported in the literature [12-14]. Devices ranging from 5×5 to 100×100 μm$^2$ were treated with 0 (reference) or 3 cycles (3-cycle) of chemical treatment before thermal activation, where each cycle of the chemical treatment consisted of 5-minute of phosphoric acid at 60° C., 5-min of ultraviolet-ozone treatment, and 5-min hydrofluoric acid dip, or were regrown using a SiO$_2$ hard mask (SAG) [11,13,15]. Thermal activation was performed with an AET RX6 rapid thermal processer under N$_2$/O$_2$ ambient at 670, 700, 730, 760, or 790° C. for 30 min. All devices were fabricated together to avoid potential processing variations. The electrical and optical data were collected by on-wafer measurements, and the efficiency performance was found from singulated devices mounted and encapsulated on silver headers and measured in an integrating sphere [4,14].

Figure 17:
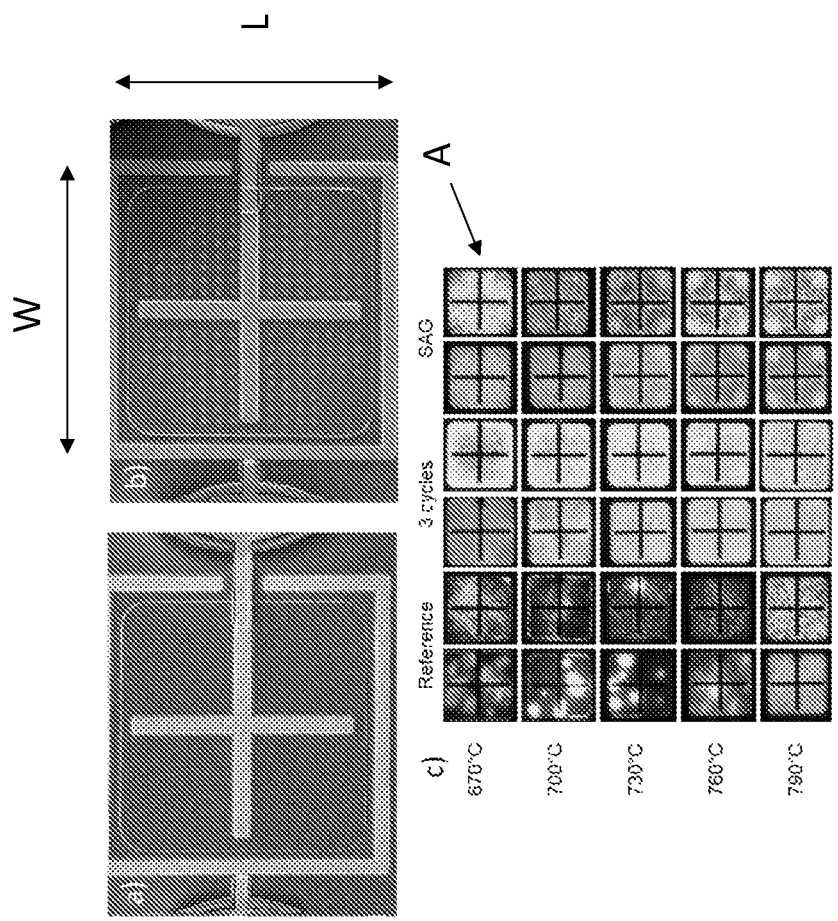
FIG. 17. SEM images of the 100×100 μm² devices (a) with chemical treatment or (b) with the SAG design. (c) The EL images of 100×100 μm² blue and green devices operating at 1 A/cm 2 activated at different temperatures.

All methods employ unique activation mechanisms, where the reference devices take advantage of activation through the device sidewalls and the activation barriers, such as nitrogen vacancies or plasma damage, are mitigated by utilizing chemical treatment before sidewall activation for the 3-cycle devices. The main difference between the SAG devices and the other two sets of devices is the holes in the SAG devices, where the openings serve as a window for hydrogen diffusion from the surface of the p-GaN layer during activation. In this case, the SAG devices have a hole diameter of 2 μm, with a pitch distance less than 10 μm to ensure complete activation [12]. FIGS. 17(*a*) and 17(*b*) present the scanning electron microscope (SEM) images of the 100×100 μm² devices with or without the SAG design. The EL images at 1 A/cm² of the 100×100 μm² devices activated at different temperatures are shown in FIG. 17(*c*). The EL profiles of the 100×100 μm² devices have distinctive features depending on the activation methods, where both the reference devices and the SAG devices resulted in inhomogeneous emission. The inhomogeneous emission seen in the reference devices was likely due to nonuniform current injection in the resistive p-GaN layer attributed to incomplete activation as reported elsewhere [13,16]. For the reference device activated at 790° C., the high temperature annealing overcame the barrier to activation and, thus, the devices showed a uniform emission profile [17]. On the other hand, the 3-cycle devices yielded uniform emission profiles at all activation temperatures. The homogenous emission profile was attributed to the effective activation in p-GaN by eliminating the activation barriers and resulting in uniform current spreading across the light-emitting area. The SAG devices, at 670° C., showed brighter emission from the exposed p-GaN area, the holes area, and dimmer emission from the corner non-exposed area, indicating that hydrogen diffusion was more effective in the exposed area at low activation temperature, and the inhomogeneous emission profile was attributed to the nonuniform current injection [18]. However, the opposite trend was observed with increasing activation temperature, where the exposed area became dimmer than the non-exposed area, suggesting that either the p-GaN or the active region was damaged during activation.

Figure 18:
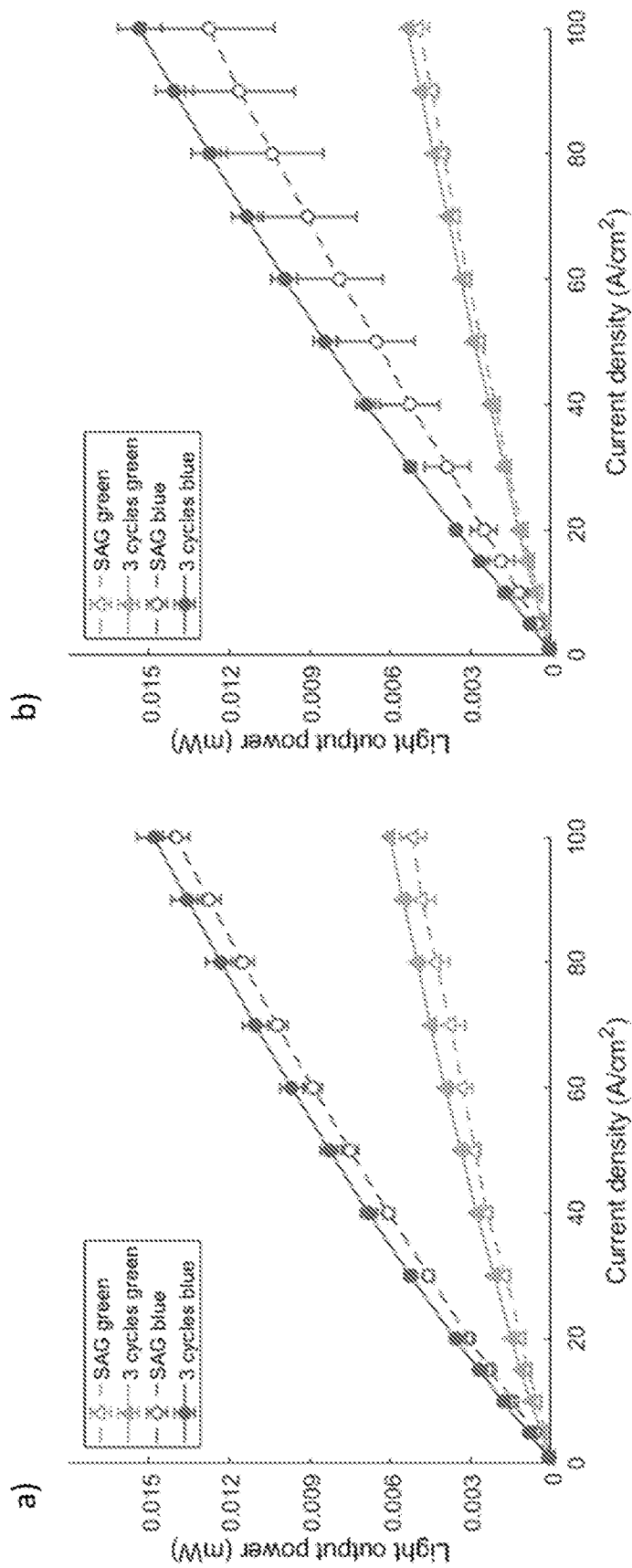
FIG. 18. LOP-current density characteristics of 20×20 μm μLEDs activated at (a) 700 and (b) 760° C.

In addition to the EL emission profiles, the optical characteristics of the devices showed significant contrasts between the different TJ activation methods. The following optical comparisons focus on the SAG devices and the 3-cycle devices. FIG. 18 shows the LOP-current density characteristics of the blue and green 20×20 μm² devices at two activation temperatures: (a) 700 and (b) 760° C. The 3-cycle devices yielded higher LOP than the SAG devices regardless of the activation temperature and the emission wavelength, where the LOP enhancements for devices activated at 700° C. at 5, 20, and 100 A/cm² were 34%, 17%, and 6% for blue and 50%, 33%, and 17% for green, respectively. Similarly, the devices activated at 760° C. yielded LOP enhancements of 54%, 42%, and 20% for blue and 52%, 14%, and 8% for green, respectively. The improvements were more significant in the low current density range, indicating that a part of the improvement was attributed to the reduction in Shockley-Read-Hall (SRH) non-radiative recombination sites by employing chemical treatment [19,20]. Additionally, the difference in light extraction efficiency between the planar and SAG designs is trivial, suggesting that the improvement in LOP was attributed to the better sidewall extraction or injection efficiency [21,22].

Other than the TJ activation method, the activation temperature serves as an important factor to the overall MOCVD-grown TJ device performance, as optimizing the temperature is crucial to minimize the voltage penalty while protecting the active region.

Figure 19:
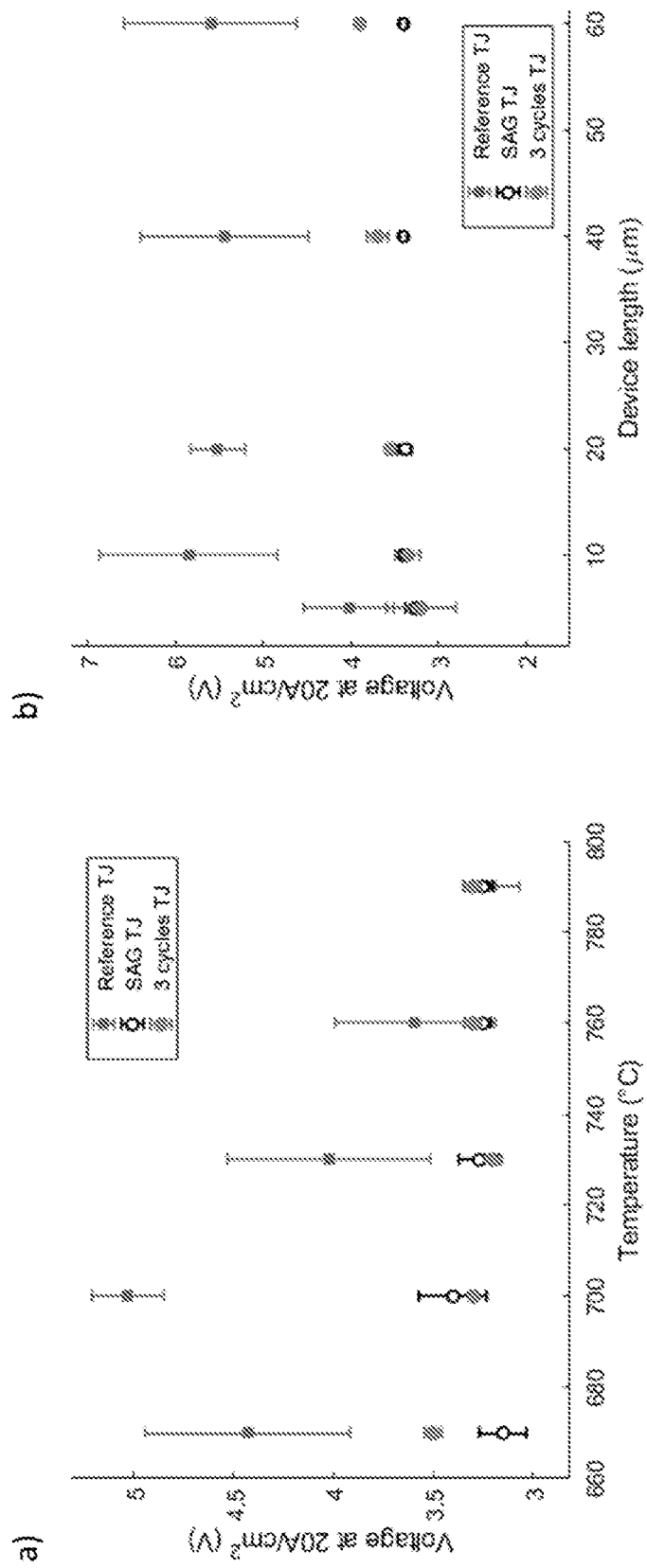
FIG. 19. (a) Voltage at 20 A/cm 2 of 5×5 μm² blue μLEDs activated at different activation temperatures and (b) voltage at 20 A/cm 2 of blue μLEDs activated at 730° C. with different device dimensions.
Figure 20:
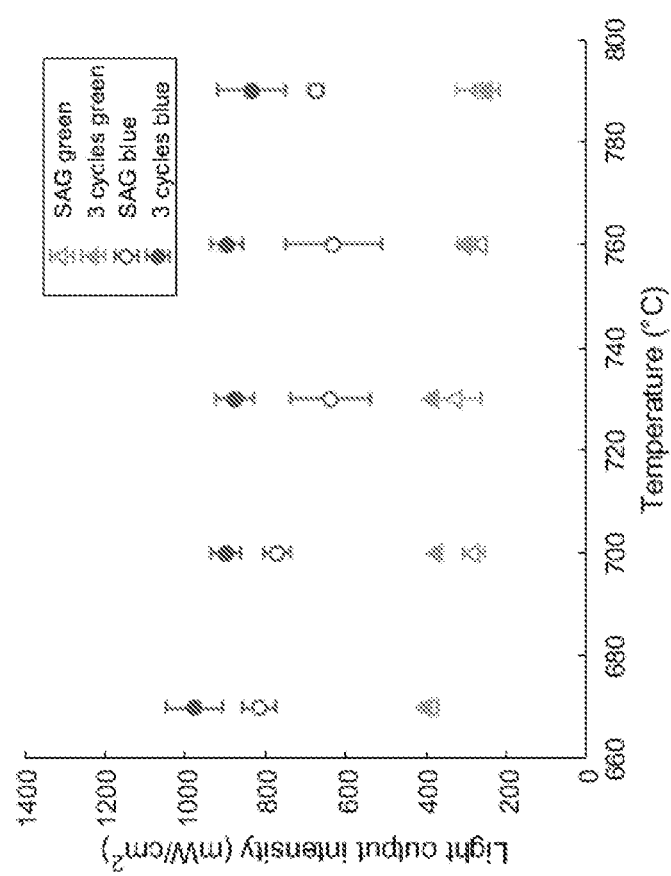
FIG. 20. Light output intensity characteristics at 20 A/cm 2 of 20×20 μm 2 μLEDs.

FIGS. 19(*a*) and 19(*b*) show the operating voltage at 20 A/cm² for the 5×5 μm² blue devices activated at different temperatures as well as size-dependent data for devices activated at 730° C. The SAG devices showed operating voltages that are independent of activation temperature and device size, suggesting that holes in the SAG architecture facilitated hydrogen diffusion from the top p-GaN surface and the voltage was limited by other components. In contrast, the reference TJ devices showed decreasing voltage penalty with activation temperatures above 760° C., and the voltage was within 5% of the operating voltages of the devices with chemical treatment and the SAG devices at 790° C. in FIG. 19(*a*).

This reduction in voltage penalty was attributed to the increasing effective hydrogen diffusion length with the increasing temperature, where high temperature either reduced activation barriers or provided more energy for diffusion to take place. For the 3-cycle devices, the operating voltage in the 5×5 μm² devices was almost identical to that of the SAG devices as presented in FIG. 19(*a*); hence, the use of chemical treatment resulted in completely activated TJ layer for the 5×5 μm² devices. Nevertheless, as shown in FIG. 19(*b*), the voltage difference enlarged more than 0.3 V for devices larger than 20×20 μm². The increase in voltage with device dimensions is a key evidence of inefficient sidewall activation as hydrogen diffusion becomes more difficult with bigger device area. For the reference devices, although activation temperatures above 760° C. yielded similar electrical characteristics as the 3-cycle devices, high activation temperature caused optical degradation in the active region, particularly in the green devices, as shown by the LOP data in FIG. 19. For the green devices, the light output intensity decreased 40% by increasing the activation temperature from 670 to 790° C., whereas the blue devices only experienced a 10% drop over the same range, suggesting that the reduction in LOP was caused by thermal degradation to the active region at high temperature [23]. Furthermore, the blue and green 3-cycle devices resulted in 27% and 15% optical improvements compared to the SAG devices at 730° C., respectively, and the improvement was attributed to the reduction in the SRH non-radiative recombination sites by using chemical treatment [19]. Both the 3-cycle and SAG green devices showed about 20% degradation in LOP above 730° C., although the scatter from ten devices in the SAG data was significant.

Figure 21:
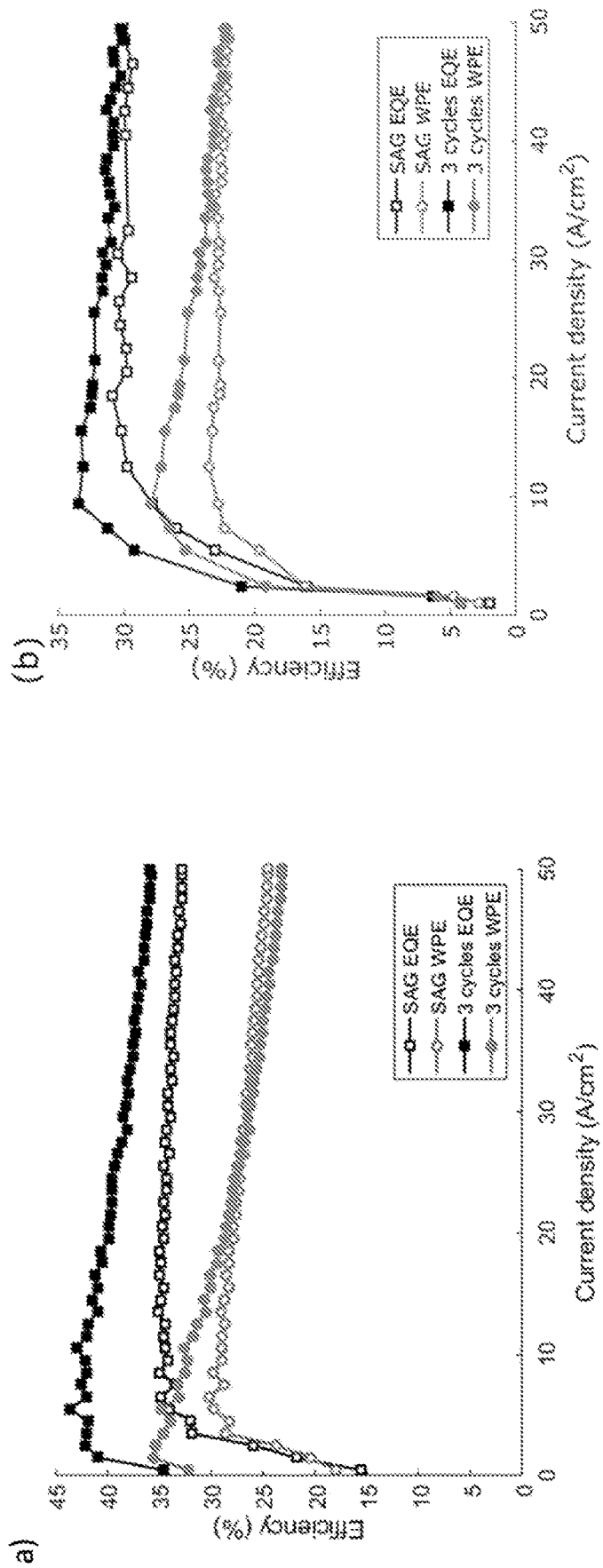
FIG. 21. EQE and WPE curves of (a) 60×60 and (b) 20×20 μm blue μLEDs.

The performances of devices employing chemical treatment before activation have been improved in terms of the optical and electrical aspects, and the benefits can also be observed in the EQE and WPE characteristics. FIG. 21 shows the EQE and WPE of 60×60 and 20×20 μm² blue devices activated at 730° C., where the 3-cycle devices resulted in higher efficiency than the SAG devices. For the 60×60 μm² devices, the differences were 20% and 10% in EQE and WPE at 10 A/cm², respectively. The 20× μm² devices with chemical treatment showed 16% enhancement in EQE and WPE relative to the SAG devices. The improvement in EQE and WPE was attributed to the increase in LOP due to the suppression of the SRH non-radiative recombination sites, whereas the enhancement in WPE was more pronounced in smaller device dimensions as the voltage difference diminished for device sizes less than 40×40 μm². The different shape in the efficiency curves could be attributed to the differences in the coefficients of the ABC model, especially in the A coefficient where the SRH nonradiative recombination sites are reduced after employing chemical treatment; however, further investigations are required to confirm [22,24].

In conclusion, the optoelectrical effects of three MOCVD-grown TJ activation techniques on InGaN based blue and green μLEDs were analyzed. The 3-cycle devices demonstrated homogeneous EL emission profiles, while the reference and SAG devices showed nonuniform emission profiles due to insufficient current injection. The 3-cycle devices yielded higher LOP compared to the SAG devices with the increase being higher at low current densities. The enhancement was partially attributed to the reduction in SRH non-radiative recombination sites using chemical treatment. Additionally, the operating voltage between the 5×5 µm$^2$ SAG devices and the 3-cycle devices showed almost identical performance, suggesting that both sets of devices yielded complete activation for devices smaller than 40×40 µm$^2$. Green devices using all three TJ activation methods exhibited significant drop in LOP for temperatures above 730° C., suggesting that the maximum activation temperature was limited by the degradation temperature in the active region. The 3-cycle devices also resulted in higher EQE and WPE than the SAG devices due to the higher LOP characteristic. This indicates that the use of chemical treatment before thermal activation is important for micrometer-scale devices with MOCVD-grown TJ contacts to yield outstanding electrical and optical performances.

REFERENCES FOR THIRD EXAMPLE

The following references are incorporated by reference herein.

1 M. S. Wong, S. Nakamura, and S. P. DenBaars, ECS J. Solid State Sci. Technol.9, 015012 (2020).
2 Y. Huang, E. L. Hsiang, M. Y. Deng, and S. T. Wu, Light: Sci. Appl. 9, 105 (2020).
3 Y. Lin, Y. Lu, W. Guo, C.-F. Lee, S.-W. Huang Chen, H.-C. Kuo, S. Liang, C.-W. Sher, T. Wu, and Z. Chen, Appl. Sci. 8, 1557 (2018).
4 M. S. Wong, J. A. Kearns, C. Lee, J. M. Smith, C. Lynsky, G. Lheureux, H. Choi, J. Kim, C. Kim, S. Nakamura, J. S. Speck, and S. P. DenBaars, Opt. Express 28, 5787 (2020).
5 Y. Robin, F. Hemeret, G. D'*Inca*, M. Pristovsek, A. Trassoudaine, and H.
Amano, Jpn. J. Appl. Phys., Part 1 58, SCCC06 (2019).
6 Z. Liu, C. Lin, B. Hyun, C. Sher, Z. Lv, B. Luo, F. Jiang, T. Wu, C. Ho, H. Kuo, and J. He, Light: Sci. Appl. 9, 1 (2020).
7 M. S. Wong, S. Nakamura, and S. P. DenBaars, High External Quantum Efficiency III-Nitride Micro-Light-Emitting Diodes, 1st ed. (Elsevier, Inc., 2021).
8 E. C. Young, B. P. Yonkee, F. Wu, S. H. Oh, S. P. DenBaars, S. Nakamura, and
J. S. Speck, Appl. Phys. Express 9, 022102 (2016).
9 S. Lee, C. A. Forman, J. Kearns, J. T. Leonard, D. A. Cohen, S. Nakamura, and S. P. DenBaars, Opt. Express 27, 31621 (2019).
10 J. Back, M. S. Wong, J. Kearns, S. P. DenBaars, C. Weisbuch, and S. Nakamura, Opt. Express 28, 29991 (2020).
11 D. Hwang, A. J. Mughal, M. S. Wong, A. I. Alhassan, S. Nakamura, and S. P.
Denbaars, Appl. Phys. Express 11, 012102 (2018).
12 P. Li, H. Zhang, H. Li, M. Iza, Y. Yao, M. S. Wong, N. Palmquist, J. S. Speck, S. Nakamura, and S. P. DenBaars, Opt. Express 28, 18707 (2020).
13 M. S. Wong, J. Back, D. Hwang, C. Lee, J. Wang, S. Gandrothula, T. Margalith, J. S. Speck, S. Nakamura, and S. P. DenBaars, Appl. Phys. Express 14, 086502 (2021).
14 M. S. Wong, D. Hwang, A. I. Alhassan, C. Lee, R. Ley, S. Nakamura, and S. P. DenBaars, Opt. Express 26, 21324 (2018).
15 P. Li, H. Zhang, H. Li, Y. Zhang, Y. Yao, N. Palmquist, M. Iza, J. S. Speck, S. Nakamura, and S. P. DenBaars, Semicond. Sci. Technol. 35, 125023 (2020).
16 J. A. Kearns, J. Back, N. C. Palmquist, D. A. Cohen, S. P. DenBaars, and S. Nakamura, Phys. Status Solidi 217, 1900718 (2020).
17 P. Tian, J. J. D. McKendry, Z. Gong, B. Guilhabert, I. M. Watson, E. Gu, Z. Chen, G. Zhang, and M. D. Dawson, Appl. Phys. Lett. 101, 231110 (2012).
18 Y. Kuwano, M. Kaga, T. Morita, K. Yamashita, K. Yagi, M. Iwaya, T. Takeuchi, S. Kamiyama, and I. Akasaki, Jpn. J. Appl. Phys. 52, 08JK12 (2013).
19 M. S. Wong, C. Lee, D. J. Myers, D. Hwang, J. A. Kearns, T. Li, J. S. Speck, S. Nakamura, and S. P. Denbaars, Appl. Phys. Express 12, 097004 (2019).
20 C. L. Maoult, D. Vaufrey, F. Martin, E. Martinez, E. Nolot, S. Cadot, and E. Gheeraert, "Analysis of InGaN surfaces after chemical treatments and atomic layer deposition of Al$_2$O$_3$ for µLED applications," in Proc. SPIE, Gallium Nitride Materials and Devices XV, 112801C, San Francisco, California, 16 Feb. 2020 (SPIE, 2020), Vol. 11280.
21 P. Li, H. Li, H. Zhang, M. Iza, J. S. Speck, S. Nakamura, and S. P. Denbaars, Semicond. Sci. Technol. 36, 035019 (2021).
22 R. T. Ley, J. M. Smith, M. S. Wong, T. Margalith, S. Nakamura, S. P. Denbaars, and M. J. Gordon, Appl. Phys. Lett. 116, 251104 (2020).
23 C. J. Youn, T. S. Jeong, M. S. Han, J. W. Yang, K. Y. Lim, and H. W. Yu, J. Cryst. Growth 250, 331 (2003).
24 F. Olivier, A. Daami, C. Licitra, and F. Templier, Appl. Phys. Lett. 111, 022104 (2017).
25. Matthew S. Wong, Joonho Back, David Hwang, Changmin Lee, Jianfeng Wang, Srinivas Gandrothula, Tal Margalith, James S. Speck, Shuji Nakamura, and Steven P. DenBaars, "Demonstration of high wall-plug efficiency III-nitride micro-light-emitting diodes with MOCVD-grown tunnel junction contacts using chemical treatments," Applied Physics Express 14, 086502 (2021), Jul. 19, 2021. The subject matter of this document was made by or originated from one or more members of the inventive entity of this patent application entitled "METHOD TO IMPROVE PERFORMANCES OF TUNNEL JUNCTIONS GROWN BY METAL ORGANIC CHEMICAL VAPOR DEPOSITION,", which application claims priority to U.S. Provisional Patent Application No. 63/154,262, filed Feb. 26, 2021, by David Hwang, Matthew S. Wong, and Shuji Nakamura, entitled "METHOD TO IMPROVE PERFORMANCES OF TUNNEL JUNCTIONS GROWN BY MOCVD,".
26. Matthew S. Wong, Nathan C. Palmquist, Jiaxiang Jiang, Philip Chan, Changmin Lee, Panpan Li, Ji Hun Kang, Yong Hyun Baek, Chae Hon Kim, Daniel A. Cohen, Tal Margalith, James S. Speck, Shuji Nakamura, and Steven P. DenBaars, "Effects of activation method and temperature to III-nitride micro-light-emitting diodes with tunnel junction contacts grown by metalorganic chemical vapor deposition" Appl. Phys. Lett. 119, 202102 (2021); doi: 10.1063/5.0073629, Nov. 16, 2021. The subject matter of this document was made by or originated from one or more members of the inventive entity of this patent application entitled "METHOD TO IMPROVE PERFORMANCES OF TUNNEL JUNCTIONS GROWN BY METAL ORGANIC CHEMICAL VAPOR DEPOSITION,", which application claims priority to U.S. Provisional Patent Application No. 63/154,262, filed Feb. 26, 2021, by David Hwang, Matthew S. Wong, and Shuji Nakamura, entitled "METHOD TO IMPROVE PERFORMANCES OF TUNNEL JUNCTIONS GROWN BY MOCVD,".

27. VoL 25. No. 24 21 Nov. 2017 OPTICS EXPRESS 30598 High wall-plug efficiency blue III-nitride LEDs designed for low current density operation, by Kuritsky et. al.

Device and Method Embodiments

The present invention can be embodied in many ways including, but not limited to, the following embodiments (referring also to FIGS. 1-22).

1. A method for fabricating a device 504 or an epitaxial layer, comprising:
removing defects from a surface 510 of a sidewall 512 of a p-type layer 502; wherein the p-type layer comprises a III-Nitride based Mg-doped layer; and
after the removing, activating the p-type layer through the sidewall to increase a hole concentration in the p-type layer (see e.g., FIG. 5).

2. The method of example 1, further comprising:
forming a mesa 514 comprising the p-type layer and the sidewall;
removing the defects from the sidewall; and
activating the p-type layer.

3. The method of examples 1 or 2, wherein the p-type layer is at least partially covered by n-type layer 516 so as to form a tunnel junction between the p-type layer and the n-type layer.

4. The method of any of the examples 1-3, wherein the activating comprises thermal annealing at one or more temperatures more than 300° C. under an ambient gas including at least one of air, $O_2$, an oxide compound, or a diatomic gas.

5. The method of any of the examples 1-4, wherein the removing comprises chemical etching of the surface of the sidewall.

6. The method of any of the examples 1-5, wherein the removing comprises chemical etching steps separated by a cleaning step.

7. The method of any of the examples 1-6, wherein the removing comprises performing one or more treatment sequences (e.g., cycles), each sequence comprising contacting the sidewall with a first acid or first base at a first temperature for a first duration, optionally cleaning the sidewall after the contacting, and, after the cleaning (if performed), optionally contacting the sidewall with a second acid or second base at a second temperature for a second duration.

8A. The method of any of the examples 1-6, wherein the removing comprises performing one or more treatment sequences, each sequence comprising contacting the sidewall with a first chemical (e.g., first acid or first base) at a first temperature for a first duration and at a first concentration, performing an optional ultraviolet ozone treatment of the sidewall after the contacting, and, after the ultraviolet ozone treatment (if performed), optionally contacting the sidewall with a second chemical (e.g., second acid or second base) at a second temperature for a second duration and a second concentration.

8B. The method of any of the examples 1-6, wherein the removing comprises: a first step using a first chemical (e.g., at least one of a first acid or first base, or first treatment) having a composition and applying the at least one of the first acid, first base, or first treatment to the surface of the sidewall at a temperature, concentration and for a duration selected to remove the defects by oxidation of the sidewalls forming an oxide, and
a second step using at second chemical (e.g., at least one of a second acid or second base) having a composition, and applying the at least one of the second acid or second base to the oxide at a temperature, concentration, and for duration selected to remove the oxide.

8C. The method of any of the examples 1-8A, 8B, or 8C, wherein the removing comprises using a first chemical (e.g., $H_3PO_4$, first acid, first base) and UV ozone for the removal of sidewall damage by oxidation, and a second chemical (e.g., buffered HF) to remove the oxide formed at the surface due to oxidation and expose GaN surface.

8D. The method of any of the examples 8A-8C, wherein the temperature and concentration are selected to speed up the process or require lower duration; however lower temperature and/or concentration can also be used by increasing the time or number of cycles. A variety of temperatures and concentrations can be used. In one or more examples, the temperature and duration can vary as a function the concentration used.

9. The method of any of the examples 7, 8A, or 8B, wherein the first duration and the second duration are selected such that the number of defects is reduced 10. The method of any of the examples 7, 8A, 8B, or 9, wherein the first acid, the first base, the second acid, or the second base comprise oxygen or hydrogen atoms (e.g., KOH, $H_3PO_4$, HCl, etc).

11. The method of any of the examples 1-10, wherein the defects comprise n-type defects.

12. The method of example 5, wherein the etching is to a depth of more than 5 nm.

13. The method of example 5 or 12, wherein the chemical etching uses a wet etchant containing oxygen or hydrogen atoms (e.g., KOH, $H_3PO_4$, HCl, etc).

14. The method of any of the examples 1-13, wherein the device comprises an optical device such as a light-emitting diode (LED), laser diode, solar cell, etc.

15. The method of any of the examples 1-14, wherein the device is an electronic device such as a transistor, HEMTs, a power electronic device, etc.

16. The method of any of the examples 1-15, wherein the device including the p-type layer is grown using metal organic chemical vapor deposition.

17. The method of any of the examples 1-16, wherein the device 504 comprises:
an active region 518 between a first n-type layer 518b and the p-type layer 502;
a second n-type layer 516 on the p-type layer; and
a tunnel junction 520 between the second n-type layer and the p-type layer.

18. The method of example 17, wherein the active layer emits electromagnetic radiation in response to a voltage applied across the first n-type layer and the second n-type layer.

19. The method of example 18, wherein the device comprises a micro LED having a surface area A less than 100 micrometers squared.

20. The method of any of the examples 1-19, wherein the device including the p-type layer is grown using metal organic chemical vapor deposition.

21. The method of any of the examples 1-16, wherein the device comprises:
   a III-Nitride active region between a first III-Nitride n-type layer and the p-type layer;
   the n-type layer comprising a second III-Nitride n-type layer on the p-type layer; and
   a tunnel junction between the second III-Nitride n-type layer and the p-type layer.

22. The method of example 21, wherein the device further comprises:
   an anode contact layer between the second III-Nitride layer and a first metal contact; and
   the first III-Nitride n-type layer comprises a cathode contact layer;
   the tunnel junction is between the anode contact layer and the cathode contact layer; and
   the device emits electromagnetic radiation in response to a recombination of holes with electrons in the active region when an electric field or voltage is applied across the anode contact layer and the cathode contact layer.

23. The method of example 22, wherein the anode contact layer comprises an $n^{++}$-type layer, n-type layer, or $n^{+}$-type layer, the first III-Nitride n-type layer comprises at least one of an n-type layer, $n^{++}$-type layer, or $n^{+}$-type layer, the second III-Nitride n-type layer comprises at least one of an $n^{++}$-type layer, an n-type layer, or an $n^{+}$-type layer, and the p-type layer comprises at least one of a $p^{++}$-type layer or a p-type layer.

24. The method of example 22 or 23, further comprising a $p^{++}$-type layer between the p-type layer and the second III-Nitride n-type layer, wherein:
   the second n-type layer and the anode contact layer comprise an $n^{+}$-GaN layer between an $n^{++}$-GaN layer and an $n^{+}$-GaN layer, such that the n-GaN layer is thicker than the n'-GaN layer and the $n^{+}$-GaN layer and a $n^{+}$-type doping concentration of the $n^{+}$-GaN layer is between a n'-doping concentration of the $n^{++}$-GaN layer and an n-doping concentration of the n-GaN layer; and
   the active region comprises InGaN.

25. The method of any of the examples 21-24, wherein the device comprises a micro-light emitting diode, the method further comprising:
   dry etching a mesa comprising the first III-Nitride n-type layer, the second III-Nitride n-type layer, the p-type layer, the tunnel junction, and the active region, wherein a top surface of the mesa has a surface area A of 100×100 micrometers squared or less; and
   performing a number n of the treatment sequences such that at least one of a resistivity or voltage between the first n-type layer and the second n-type layer, at a given current density flowing between the first n-type layer and the second n-type layer, is reduced as compared to that achieved for n−1 treatment sequences and $n^{+}1$ treatment sequences.

26. The method of any of the examples 21-24, wherein the device comprises a micro-light emitting diode comprising an anode contact layer and a cathode contact layer, the method further comprising:
   dry etching a mesa comprising the first III-Nitride n-type layer, the second n-III-Nitride type layer, the p-type layer, the tunnel junction, and the active region, wherein a top surface of the mesa has a surface area A of 60×60 micrometers squared or less; and
   performing a number n of the treatment sequences such that a voltage of 4 volts or less is between the cathode contact layer and the anode contact layer when a current density of 20 Amps per centimeter square is flowing between the anode contact layer and the cathode contact layer.

27. The method of any of the examples 21-24, wherein the device comprises a micro-light emitting diode, the method further comprising:
   dry etching a mesa comprising the first n-type layer, the second n-type layer, the p-type layer, the tunnel junction, and the active region, wherein a top surface of the mesa has a surface area A of 60×60 micrometers squared or less; and
   performing a number n of the treatment sequences such that a peak external quantum efficiency and a peak wall plug efficiency of the microled are both greater than 50% and the wall plug efficiency and the external quantum efficiency are both greater than 30% for the current density up to 30 Amps per centimeter square.

28. The method of any of the examples 21-27, wherein the microled is a blue microled emitting the electromagnetic radiation having a peak intensity at a blue wavelength.

29. The method of any of the example 28, further comprising performing the number n of treatment sequences wherein the light output power, external quantum efficiency, and wall plug efficiency are higher as compared to an equivalent microled without the tunnel junction and second n-type layer but further including an indium tin oxide p-contact layer on the p-type layer.

30. The method of any of the examples 21-27, wherein the microled is a green microled emitting the electromagnetic radiation having a peak intensity at a green wavelength.

31. The method of example 30, wherein the green microled has a light output power of at least 0.005 mW at a current density of 100 Amps per centimeter square.

32. The method of any of the examples 21-31, wherein the microled has a higher light output power, external quantum efficiency, and wall plug efficiency, and lower voltage, as compared to an equivalent led activated by thermal annealing through holes in mask on top of the mesa but without the sequence of treatments.

33. The method of any of the examples 21-32, further comprising selecting a thermal annealing temperature for activation that reduces the voltage between the anode contact layer and the cathode contact layer for the number of treatment sequences.

34. The method of example 33, wherein the annealing temperature is between 750 degrees Celsius and 800 degrees Celsius.

35. A device manufactured using the method of any of the examples 1-34.

36. A device 2200, 504 comprising:
   an activated p-type layer 2202, 502 comprising a III-Nitride based Mg-doped layer grown by vapor phase deposition or a growth method different from MBE (e.g., that incorporates hydrogen), wherein the p-type layer is activated through a sidewall 2250, 512 of the p-type layer after the removal of defects from the sidewall so as to increase a hole concentration of/in the p-type layer as compared to without the removal of the defects.

37. The device of example 36, further comprising:
an active region 2208, 518 between a first n-type layer 2210 and the p-type layer;
a second n-type layer 2204 on the p-type layer; and
a tunnel junction 2206 between the second n-type layer and the p-type layer.

38. The device of example 37, wherein the activated p-type layer has a hole concentration characterized by a current density of at least 100 Amps per centimeter square flowing between the first n-type layer and the second n-type layer in response to a voltage of 4 volts or less applied across the first n-type layer and the second n-type layer.

39. The device of example 37 or 38, further comprising a light emitting device and a mesa 2252 comprising first the n-type layer, the second n-type layer, the p-type layer, and the active region, wherein the mesa has a light emitting top surface 2254 having an area A of 60 micron squared or less.

40. The device of example 39, wherein the area is 5 micron squared or less.

41. The device of any of the examples 38-40, wherein the current density is at least 300 amps per centimeter square.

42. The device of any of the examples 36-41, wherein the activated p-type layer has a hole concentration characterized by the device having a wall plug efficiency of at least 25%.

43. The device of any of the examples 36-42, wherein the device comprises a light emitting diode (e.g., micro LED), a laser, a solar cell, or a photodetector.

44. The device of example 43, comprising a transistor.

45. The device of example 43, comprising an electronic or optoelectronic device.

46. The device of any of the examples 36-45 manufactured by the method of any of the examples 1-35.

47. In III-nitride based devices or epitaxial layers, a III-nitride based Mg-doped layer is activated to increase the hole concentration through the sidewall of Mg-doped layer after removing at least a surface of the sidewall of Mg-doped layer.

48. After forming the mesa of III-nitride devices or epitaxial layers, the III-nitride based Mg-doped layer is activated to increase the hole concentration through the sidewall of Mg-doped layer of the mesa after removing at least surface of the sidewall of Mg-doped layer.

49. In any of the examples 47-48, the III-nitride based devices or epitaxial layers include a tunnel junction, wherein Mg-doped layer is covered at least at some region by n-type layer.

50. In any of the examples 47-49, for the activation, thermal annealing is used at temperatures more than 300° C. under the ambient gas which at least include air, $O_2$ or oxide compound or diatomic gases.

51. In any of the examples 47-50, chemical etching is used to remove at least surface of the sidewall of Mg-doped layer.

52. In the example 51, the sidewall etching depth is more than 5 nm.

53. In the examples 51-52, the wet etchant contains oxygen or hydrogen atoms, includes KOH, $H_3PO_4$, HCl, etc.

54. In any of the examples 47-53, the device is an optical device such as a light-emitting diode (LED), laser diode, solar cell, or other device.

55. In any of the examples 47-54, wherein the device is an electronic device such as a transistor, High Electron Mobility Transistor (HEMT), a power device, etc.

56. The device or method of any of the examples 1-55, wherein the activation comprises removal of hydrogen from the p-type layer.

57. The device or method of any of the examples 1-56, wherein the p-type layer is characterized by having been grown by MOCVD and activation through the sidewall.

58. The device or method of any of the examples 1-57, wherein charge carriers tunnel across the tunnel junction via quantum mechanical tunneling.

Figure 22:
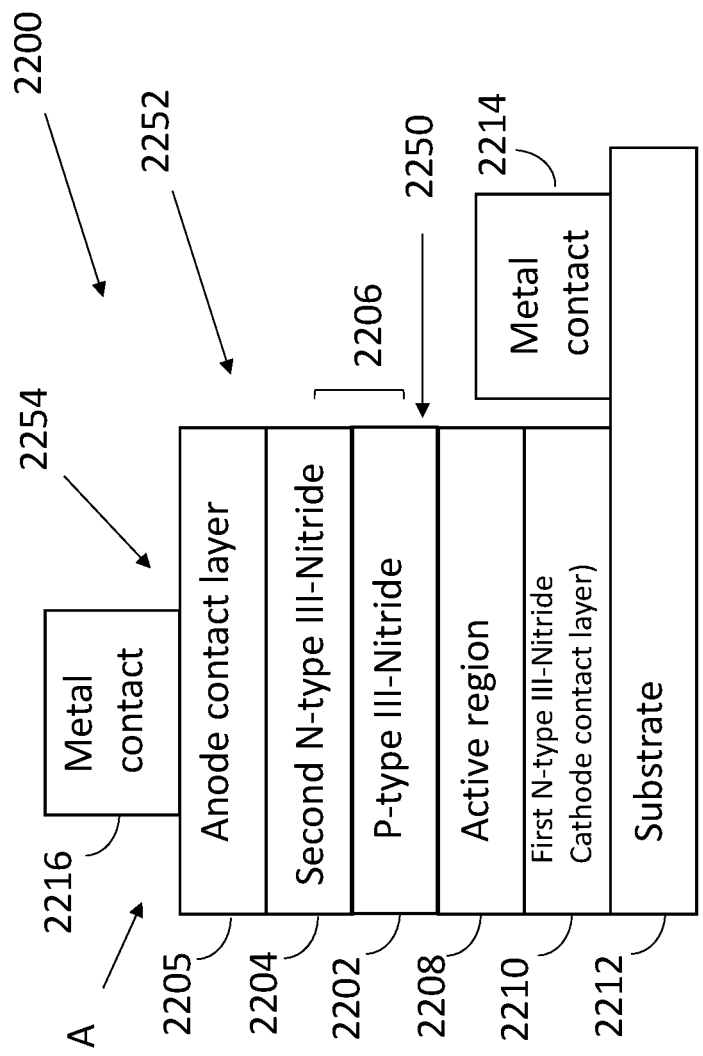
FIG. 22. Cross-Sectional schematic of an LED according to one or more examples.

59. FIG. 22 illustrates a device 2200, comprising:
a mesa 2252;
a first metal contact 2216 on the mesa, wherein the mesa comprises:
 a III-Nitride active region 2208 between a cathode contact layer 2210 and a p-type layer 2202, wherein the cathode contact layer comprises a first III-Nitride n-type layer;
 a second III-Nitride n-type layer 2204 on the p-type layer forming a tunnel junction 2206 between the second III-Nitride n-type layer and the p-type layer;
 an n-type anode contact layer 2205 between the second III-Nitride layer and the first metal contact; and
a second metal contact 2214 on the anode contact layer; wherein:
 the device emits electromagnetic radiation in response to a recombination of holes with electrons in the active region when an electric field or voltage is applied across the anode contact layer and the cathode contact layer, and
 the p-type layer has a chemically treated sidewall 2250 comprising a reduced number of defects of a type that:
 are formed during formation of the mesa by dry etching, and
 suppress diffusion of hydrogen formed during growth of the p-type layer out of the p-type layer during thermal activation of the device, and
 so as to increase a hole concentration and reduce a voltage across the anode contact layer and the cathode contact layer for a given current density flowing between the anode contact layer and the cathode contact layer.

60. The device of example 59, wherein the reduced number of defects increase at least one of a light output power, an external quantum efficiency, or a wall plug efficiency of the device.

61. The device of example 59, wherein the reduced number of defects increase at least one of a light output power, an external quantum efficiency, or a wall plug efficiency of the device.

62. The device of example 59 or 60, wherein the voltage is between 2.5 V and 4V for the current density of 20 Amps per centimeter square.

63. The device of any of the examples 59-61, wherein a hole concentration in the p-type layer and an electron concentration in the first III-Nitride n-type layer are such that:
the external quantum efficiency and the wall plug efficiency are in a range of 25%-60% for a current density in a range 2-70 Amps per centimeter square, and
a top of the mesa has a surface area A of 60×60 microns squared or less (e.g., in one or more examples A=length L×Width W, see e.g., FIG. 17).

64. The device of example 59, wherein the device comprises a green light emitting diode, the electromagnetic radiation comprises has a power of at least 0.003 mW at a green wavelength 65. The device of any of the examples 59-63, wherein the reduced number of defects reduce a number of Mg acceptors in the p-type region that are not thermally activated to activate Mg dopants passivated by hydrogen in the p-type layer.

66. In one or more of the examples 1-65, external quantum efficiency (EQE)=IQE×LEE=(P/hv)/(I/q) where P is optical output power, I is applied current, h is planck's constant, and v is frequency of the electromagnetic radiation, and EQE can be determined from spatially integrated electroluminscence, and measurements of output power and average photon energy. IQE is internal quantum efficiency, the fraction of electrons injected into active region that generate photons in the active region. LEE is fraction of photons generated in the active region that escape into free space. Peak EQE is the maximum EQE [27].

67. In one or more examples 1-66, wall plug efficiency (WPE) is defined as IQE×LEE×Vp/V and Vp/V accounts for ohmic losses, where Vp is hv/q and V is the operating voltage [27].

68. In one or more examples 1-67, $n^+$-type doping concentration of the $n^+$-type layer is between a n'-doping concentration of the $n^{++}$-type layer and an n-doping concentration of the n-type layer; $p^+$-type doping concentration of the $p^+$-type layer is between a $p^{++}$-doping concentration of the $p^{++}$-type layer and a p-doping concentration of the p-type layer).

Advantages and Improvements

A TJ is commercially useful for LED and laser applications because the TJ serves as the current spreading layer. Compared to other conventional current spreading layers, including semi-transparent metal layers, such as Ni/Au, or transparent and conductive oxides (TCOs), such as indium-tin oxide (ITO), the TJ is more optically transparent or less absorbing, which allows more light emitted from the device and enhances the light extraction efficiency of LEDs and lasers. A TJ grown by MOCVD is attractive, because MOCVD has been used widely in industry for III-nitride materials. The main drawback for the TJ grown by MOCVD is the voltage penalty due to insufficient hydrogen activation in the p-type layer, which increases the operating voltage and reduces the electrical efficiency. This invention provides a method to activate the p-type layer effectively from the sidewall using traditional cleanroom fabrication techniques.

Nomenclature

GaN and its ternary and quaternary compounds incorporating aluminum (Al) and indium (In) (AlGaN, InGaN, AlInGaN) are commonly referred to using the terms (Al,Ga,In)N, III-nitride, III-N, Group III-nitride, nitride, Group III-N, $Al_{(1-x-y)}In_yGa_xN$ where 0<x<1 and 0<y<1, or AlInGaN, as used herein. In addition, Scandium and Yttrium and other transition metal nitrides exist and alloys between transition metal nitrides and (Al,Ga,In)N can be formed (Al, Ga, In, Sc, Y)N. Boron nitride is another nitride which can form an alloy with (Al,Ga,In)N or (Al, Ga, In, Sc, Y)N. All these terms are intended to be equivalent and broadly construed to include respective nitrides of the single species, Al, Ga, and In, as well as binary, ternary and quaternary compositions of such Group III metal species. Accordingly, these terms comprehend the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species. Further, (Al,Ga,In)N materials within the scope of the invention may further include minor quantities of dopants and/or other impurity or inclusional materials. Boron (B) may also be included.

Group III-V material comprises an alloy of group III and group V elements in the periodic table.

One approach to eliminating the spontaneous and piezoelectric polarization effects in GaN or III-nitride based optoelectronic devices is to grow the III-nitride devices on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga, Al,In,B)N devices is to grow the devices on semi-polar planes of the crystal. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero 1 Miller index.

Some commonly observed examples of semi-polar planes include the (11-22), (10-11), and (10-13) planes. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and (10-13) planes are at 62.98 and 32.06 to the c-plane, respectively.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A device comprising:
an activated p-type layer comprising a III-Nitride based magnesium doped (Mg-doped) layer grown by vapor phase deposition or a growth method different from molecular beam epitaxy (MBE), wherein the p-type layer is activated through a sidewall of the p-type layer after a removal of defects from the sidewall so as to increase a hole concentration in the p-type layer as compared to without the removal of the defects; and an active region or layer between a first III-Nitride n-type layer and the p-type layer;

a second III-Nitride n-type layer on the p-type layer; and a tunnel junction between the second III-Nitride n-type layer and the p-type layer; and wherein the activated p-type layer has the hole concentration characterized by a current density of at least 100 Amps per centimeter square flowing between the first III-Nitride n-type layer and the second III-Nitride n-type layer in response to a voltage of 4 volts or less applied across the first III-Nitride n-type layer and the second III-Nitride n-type layer.

2. The device of claim 1, further comprising a light emitting device and a mesa comprising first the III-Nitride n-type layer, the second III-Nitride n-type layer, the p-type layer, and the active region, wherein the mesa has a light emitting top surface having an area of 60 microns squared or less.

3. The device of claim 2, wherein the area is 5 microns squared or less.

4. The device of claim 1, wherein the current density is at least 300 amps per centimeter square.

5. The device of claim 1, wherein the activated p-type layer has the hole concentration characterized by the device having a wall plug efficiency of at least 25%.

6. The device of claim 1, wherein the device comprises a light emitting diode, a laser, a solar cell, or a photodetector.

7. The device of claim 1, comprising a transistor.

8. The device of claim 1, comprising an electronic or optoelectronic device.

9. The device of claim 1, wherein the vapor phase deposition comprises metal organic chemical vapor phase deposition.

10. A device, comprising:

a mesa;

a first metal contact on the mesa, wherein the mesa comprises:

a III-Nitride active region between a cathode contact layer and a p-type layer, wherein the cathode contact layer comprises a first III-Nitride n-type layer;

a second III-Nitride n-type layer on the p-type layer forming a tunnel junction between the second III-Nitride n-type layer and the p-type layer;

an n-type anode contact layer between the second III-Nitride n-type layer and the first metal contact; and a second metal contact on the cathode contact layer;

wherein:

the device emits electromagnetic radiation in response to a recombination of holes with electrons in the III-Nitride active region when an electric field or voltage is applied across the anode contact layer and the cathode contact layer using the first metal contact and the second metal contact, and the p-type layer has a chemically treated sidewall comprising a reduced number of defects of a type that:

are formed during formation of the mesa by dry etching, and suppress diffusion of hydrogen, formed during growth of the p-type layer, out of the p-type layer during a thermal activation of the device, and the reduced number of defects increase a hole concentration and reduce a voltage across the anode contact layer and the cathode contact layer for a given current density flowing between the anode contact layer and the cathode contact layer.

11. The device of claim 10, wherein the reduced number of defects increase at least one of a light output power, an external quantum efficiency, or a wall plug efficiency of the device.

12. The device of claim 10, wherein the voltage is between 2.5 V and 4V for the current density of 20 Amps per centimeter square.

13. The device of claim 10, wherein the hole concentration in the p-type layer and an electron concentration in the first III-Nitride n-type layer are such that:

an external quantum efficiency and a wall plug efficiency are in a range of 25%-60% for a current density in a range 2-70 Amps per centimeter square, and a top of the mesa has a surface area of 60×60 microns squared or less.

14. The device of claim 10, wherein the device comprises a green light emitting diode, the electromagnetic radiation comprises has a power of at least 0.003 mW at a green wavelength.

15. The device of claim 10, wherein the reduced number of defects reduce a number of magnesium (Mg) acceptors in the p-type layer that are not thermally activated to activate Mg dopants passivated by hydrogen in the p-type layer.

* * * * *